US012752465B2

(12) United States Patent
Sitti et al.

(10) Patent No.: US 12,752,465 B2
(45) Date of Patent: Oct. 6, 2026

(54) METHOD OF MAKING ONE OR MORE FIBRILS, COMPUTER IMPLEMENTED METHOD OF SIMULATING AN ADHESIVE FORCE OF ONE OR MORE FIBRILS AND FIBRIL

(71) Applicant: MAX-PLANCK-GESELLSCHAFT ZUR FÖRDERUNG DER WISSENSCHAFTEN E.V., Munich (DE)

(72) Inventors: Metin Sitti, Stuttgart (DE); Ville Liimatainen, Ehningen (DE); Donghoon Son, Stuttgart (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 40 days.

(21) Appl. No.: 18/281,093

(22) PCT Filed: Mar. 11, 2022

(86) PCT No.: PCT/EP2022/056341
§ 371 (c)(1),
(2) Date: Sep. 8, 2023

(87) PCT Pub. No.: WO2022/189631
PCT Pub. Date: Sep. 15, 2022

(65) Prior Publication Data
US 2024/0149501 A1 May 9, 2024

(30) Foreign Application Priority Data
Mar. 12, 2021 (EP) .................................... 21162253

(51) Int. Cl.
*B29C 39/02* (2006.01)
*G06F 30/23* (2020.01)
*G06F 30/27* (2020.01)

(52) U.S. Cl.
CPC ........... *B29C 39/026* (2013.01); *G06F 30/23* (2020.01); *G06F 30/27* (2020.01)

(58) Field of Classification Search
CPC ........ B29C 39/026; G06F 30/23; G06F 30/27
(Continued)

(56) References Cited

U.S. PATENT DOCUMENTS

2014/0010988 A1 1/2014 Sitti
2015/0187116 A1* 7/2015 Stomakhin .............. G06T 13/60
345/419

(Continued)

FOREIGN PATENT DOCUMENTS

WO 2007062025 A1 5/2007

OTHER PUBLICATIONS

European Search Report corresponding to EP21162253 dated Sep. 7, 2021, 17 pages.

(Continued)

*Primary Examiner* — Christina A Johnson
*Assistant Examiner* — Xue H Liu
(74) *Attorney, Agent, or Firm* — Dickinson Wright PLLC

(57) ABSTRACT

The present invention relates to a method of making one or more fibrils, the method comprising the steps of providing a material of manufacture of the one or more fibrils; providing a random initial shape of the one or more fibrils, with each fibril of the one or more fibrils comprising several surfaces; calculating an adhesive force of the one or more fibrils based on the material of manufacture of the one or more fibrils and on the provided random initial shape of the one or more fibrils, i.e. of their several surfaces; adapting, in particular
(Continued)

iteratively adapting, the random initial shape of the one or more fibrils to vary the adhesive force of the one or more fibrils to form resultant shapes of the one or more fibrils and determining the corresponding adhesive force of each resultant shape of the one or more fibrils; selecting the resultant shape of the one or more fibrils having the highest adhesive force of the one or more fibrils; and producing one or more fibrils having the selected resultant shape having the highest adhesive force of the one or more fibrils. The invention further relates to a computer implemented method of simulating an adhesive force of one or more fibrils and to a fibril.

15 Claims, 12 Drawing Sheets

(58) Field of Classification Search
USPC .......................................................... 264/299
See application file for complete search history.

(56) References Cited

U.S. PATENT DOCUMENTS

2015/0368519 A1 12/2015 Sitti
2018/0264657 A1 9/2018 Dadkhah Tehrani

OTHER PUBLICATIONS

International Search Report corresponding to International Application No. PCT/EP2022/056341 dated Jul. 6, 2022, 23 pages.
Kim, Yongtae, et al. "Designing an adhesive pillar shape with deep learning-based optimization." ACS applied materials interfaces 12.21 (2020): 24458-24465.
Liimatainen, Ville, et al. "Liquid-superrepellent bioinspired fibrillar adhesives." Advanced Materials 32.19 (2020): 2000497.
Son, Donghoon, Ville Liimatainen, and Metin Sitti. "Machine Learning-Based and Experimentally Validated Optimal Adhesive Fibril Designs." Small 17.39 (2021): 2102867.
A. Mannodi-Kanakkithodi, G. Pilania, T. D. Huan, T. Lookman, R. Ramprasad, Sci. Rep. 2016, 6, 1.
O. Hennigh, in 6th Int. Conf. Learn. Represent. ICLR 2018—Work. Track Proc., 2018, pp. 1-12.
M. Shimoda, T. Nagano, J. X. Shi, Struct. Multidiscip. Optim. 2019, 59, 1543.
C. Chen, Y. Zuo, W. Ye, X. Li, Z. Deng, S. P. Ong, Adv. Energy Mater. 2020, 10, 1903242.
J. Snoek, H. Larochelle, R. P. Adams, in Adv. Neural Inf. Process. Syst. 25, 2012, pp. 2960-2968.
B. Shahriari, K. Swersky, Z. Wang, R. P. Adams, N. De Freitas, Proc. IEEE 2015, 104, 148.
E. Brochu, V. M. Cora, N. de Freitas, arXiv1012.2599, v1, Submitt. Dec. 2010.
H. J. Kushner, J. Basic Eng. 1964, 86, 97.
M. A. Osborne, R. Garnett, S. J. Roberts, in 3rd Int. Conf. Learn. Intell. Optim., 2009, pp. 1-15.
D. R. Jones, J. Glob. Optim. 2001, 21, 345.
Y. Kim, C. Yang, Y. Kim, G. X. Gu, S. Ryu, ACS Appl. Mater. Interfaces 2020, 12, 24458.
M. E. Mortenson, Mathematics for Computer Graphics Applications, Industrial Press Inc., 1999.
D. M. Hawkins, J. Chem. Inf. Comput. Sci. 2004, 44, 1.
M. Mooney, J. Appl. Phys. 1940, 11, 582.
R. S. Rivlin, Philos. Trans. R. Soc. London. Ser. A, Math. Phys. Sci. 1948, 241, 379.
D. S. Dugdale, J. Mech. Phys. Solids 1960, 8, 100.
G. I. Barenblatt, Adv. Appl. Mech. 1962, 7, 55.
T. Tang, C. Y. Hui, N. J. Glassmaker, J. R. Soc. Interface 2005, 2, 505.
R. Calandra, A. Seyfarth, J. Peters, M. P. Deisenroth, Ann. Math. Artif. Intell. 2016, 76, 5.
D. Sameoto, C. Menon, Smart Mater. Struct. 2010, 19, 103001.
V. Kanyanta, A. Ivankovic, J. Mech. Behav. Biomed. Mater. 2010, 3, 51.
S. N. Khaderi, N. A. Fleck, E. Arzt, R. M. McMeeking, J. Mech. Phys. Solids 2015, 75, 159.
M. Micciche, E. Arzt, E. Kroner, ACS Appl. Mater. Interfaces 2014, 6, 7076.
I. D. Johnston, D. K. Mccluskey, C. K. L. Tan, M. C. Tracey, J. Micromechanics Microengineering 2014, 24, 035017.
D. Maugis, Contact, Adhesion and Rupture of Elastic Solids, Springer Science Business Media, 2013.
L. F. Boesel, C. Cremer, E. Arzt, A. Del Campo, Adv. Mater. 2010, 22, 2125.
R. Hensel, K. Moh, E. Arzt, Adv. Funct. Mater. 2018, 28, 1800865.
G. M. Guidoni, D. Schillo, U. Hangen, G. Castellanos, E. Arzt, R. M. McMeeking, R. Bennewitz, J. Mech. Phys. Solids 2010, 58, 1571.
H. Marvi, S. Song, M. Sitti, Langmuir 2015, 31, 10119.
R. G. Balijepalli, M. R. Begley, N. A. Fleck, R. M. McMeeking, E. Arzt, Int. J. Solids Struct. 2016, 85-86, 160.
A. Filippov, V. L. Popov, S. N. Gorb, J. Theor. Biol. 2011, 276, 126.
B. S. Bschaden, Developing Design Guidelines for Improved Gecko Inspired Dry Adhesive Performance, University of Alberta, 2014.
D. Sameoto, in Bio-Inspired Struct. Adhes., Springer, Cham, 2017, pp. 221-244.
R. Ruibal, V. Ernst, J. Morphol. 1965, 117, 271.
K. Autumn, M. Sitti, Y. A. Liang, A. M. Peattie, W. R. Hansen, S. Sponberg, T. W. Kenny, R. Fearing, J. N. Israelachvili, R. J. Full, Proc. Natl. Acad. Sci. U. S. A. 2002, 99, 12252.
K. Autumn, Y. A. Liang, S. T. Hsieh, W. Zesch, W. P. Chan, T. W. Kenny, R. Fearing, R. J. Full, Nature 2000, 405, 681.
J. Y. Chung, M. K. Chaudhury, J. R. Soc. Interface 2005, 2, 55.
M. Kamperman, E. Kroner, A. Del Campo, R. M. McMeeking, E. Arzt, Adv. Eng. Mater. 2010, 12, 335.
M. Sitti, R. S. Fearing, J. Adhes. Sci. Technol. 2003, 17, 1055.
A. Ghatak, L. Mahadevan, J. Y. Chung, M. K. Chaudhury, V. Shenoy, Proc. R. Soc. A Math. Phys. Eng. Sci. 2004, 460, 2725.
Y. Tian, N. Pesika, H. Zeng, K. Rosenberg, B. Zhao, P. McGuiggan, K. Autumn, J. Israelachvili, Proc. Natl. Acad. Sci. U. S. A. 2006, 103, 19320.
M. P. Murphy, B. Aksak, M. Sitti, Small 2009, 5, 170.
Y. Menguc, S. Y. Yang, S. Kim, J. A. Rogers, M. Sitti, Adv. Funct. Mater. 2012, 22, 1246.
S. Kim, E. Cheung, M. Sitti, Langmuir 2009, 25, 7196.
Y. Menguc, M. Rohrig, U. Abusomwan, H. Holscher, M. Sitti, J. R. Soc. Interface 2014, 11, 20131205.
X. Li, D. Tao, H. Lu, P. Bai, Z. Liu, L. Ma, Y. Meng, Y. Tian, Surf. Topogr. Metrol. Prop. 2019, 7, 023001.
C. Greiner, E. Arzt, A. Del Campo, Adv. Mater. 2009, 21, 479.
M. P. Murphy, S. Kim, M. Sitti, ACS Appl. Mater. Interfaces 2009, 1, 849.
H. K. Minsky, K. T. Turner, Appl. Phys. Lett. 2015, 106, 201604.
S. C. L. Fischer, E. Arzt, R. Hensel, ACS Appl. Mater. Interfaces 2017, 9, 1036.
D. M. Drotlef, C. B. Dayan, M. Sitti, Integr. Comp. Biol. 2019, 59, 227.
V. Liimatainen, D. M. Drotlef, D. Son, M. Sitti, Adv. Mater. 2020, 32, 2000497.
M. K. Kwak, H. E. Jeong, K. Y. Suh, Adv. Mater. 2011, 23, 3949.
W. G. Bae, D. Kim, M. K. Kwak, L. Ha, S. M. Kang, K. Y. Suh, Adv. Healthc. Mater. 2013, 2, 109.
D. M. Drotlef, M. Amjadi, M. Yunusa, M. Sitti, Adv. Mater. 2017, 29, 1701353.
S. Song, M. Sitti, Adv. Mater. 2014, 26, 4901.
S. Song, D.-M. Drotlef, C. Majidi, M. Sitti, Proc. Natl. Acad. Sci. 2017, 114, E4344.
B. Aksak, M. P. Murphy, M. Sitti, Proc.—IEEE Int. Conf. Robot. Autom. 2008, 3058.
S. Kim, M. Spenko, S. Trujillo, B. Heyneman, D. Santos, M. R. Cutkosky, IEEE Trans. Robot. 2008, 24, 65.
M. P. Murphy, C. Kute, Y. Menguc, M. Sitti, Int. J. Rob. Res. 2011, 30, 118.
H. Gao, H. Yao, Proc. Natl. Acad. Sci. 2004, 101, 7851.

(56) References Cited

OTHER PUBLICATIONS

A. Del Campo, C. Greiner, E. Arzt, Langmuir 2007, 23, 10235.
C. Greiner, A. Del Campo, E. Arzt, Langmuir 2007, 23, 3495.
A. V. Spuskanyuk, R. M. McMeeking, V. S. Deshpande, E. Arzt, Acta Biomater. 2008, 4, 1669.
N. A. Fleck, S. N. Khaderi, R. M. McMeeking, E. Arzt, J. Mech. Phys. Solids 2017, 101, 30.
B. Aksak, K. Sahin, M. Sitti, Beilstein J. Nanotechnol 2014, 5, 630.
B. Aksak, C.-Y. Y. Hui, M. Sitti, J. R. Soc. Interface 2011, 8, 1166.
L. Heepe, A. E. Kovalev, A. E. Filippov, S. N. Gorb, Phys. Rev. Lett. 2013, 111, 1.
L. Heepe, S. N. Gorb, Annu. Rev. Mater. Res. 2014, 44, 173.
M. Varenberg, S. Gorb, J. R. Soc. Interface 2008, 5, 785.
[S. Gorb, M. Varenberg, A. Peressadko, J. Tuma, J. R. Soc. Interface 2007, 4, 271.
S. Kim, M. Sitti, Appl. Phys. Lett. 2006, 89, 261911.
M. P. Murphy, B. Aksak, M. Sitti, J. Adhes. Sci. Technol. 2007, 21, 1281.
G. Carbone, E. Pierro, Small 2012, 8, 1449.
R. G. Balijepalli, M. R. Begley, N. A. Fleck, R. M. McMeeking, E. Arzt, Int. J. Solids Struct. 2016, 85, 160.
G. Carbone, E. Pierro, S. N. Gorb, Soft Matter 2011, 7, 5545.
G. S. Hornby, A. Globus, D. S. Linden, J. D. Lohn, in Sp. 2006, 2006, p. 7242.
C. Bisagni, L. Lanzi, Compos. Struct. 2002, 58, 237.
G. X. Gu, C. T. Chen, M. J. Buehler, Extrem. Mech. Lett. 2018, 18, 19.
C. H. Yu, Z. Qin, M. J. Buehler, Nano Futur. 2019, 3, 035001.
C. M. Hamel, D. J. Roach, K. N. Long, F. Demoly, M. L. Dunn, H. J. Qi, Smart Mater. Struct. 2019, 28, 065005.
I. Santos, J. Nieves, Y. K. Penya, P. G. Bringas, in 2009 Iccas-Sice, IEEE, 2009, pp. 4536-4541.
G. Pilania, C. Wang, X. Jiang, S. Rajasekaran, R. Ramprasad, Sci. Rep. 2013, 3, 1.

* cited by examiner

METHOD OF MAKING ONE OR MORE FIBRILS, COMPUTER IMPLEMENTED METHOD OF SIMULATING AN ADHESIVE FORCE OF ONE OR MORE FIBRILS AND FIBRIL

CROSS-REFERENCES TO RELATED APPLICATIONS

This application is a 371 National Phase Application of International Application PCT/EP2022/056341, filed on Mar. 11, 2022, which claims the benefit of European Application No. 21162253.5, filed on Mar. 12, 2021. The entire disclosures of the applications referenced above are incorporated herein by reference.

The present invention relates to a method of making one or more fibrils, the method comprising the steps of providing a material of manufacture of the fibrils; providing a random initial shape of the fibrils; calculating an adhesive force of the fibrils based on the material of manufacture of the fibrils and on the initial shape of the fibrils; adapting the random initial shape of the fibrils to maximize the adhesive force of the fibrils to form resultant shapes of the fibrils; selecting the resultant shape of the fibrils having the highest adhesive force of the fibrils; and producing having the selected resultant shape having the highest adhesive force of the fibrils. The invention further relates to a computer implemented method of simulating an adhesive force of one or more fibrils and to a fibril.

Geckos can climb almost any surface in nature swiftly and effortlessly. Such incredible climbing ability comes from the hair-like microstructures, setae, on their feet. The setae branch into many smaller hairs of seta with a spatulated tip ending, where these tips directly contact and adhere to surfaces leveraging mainly the most universal intermolecular force, the van der Waals force. The hierarchical and branching fibrillar structure of setae enable exploiting contact splitting and crack trapping and adhesion to even rough surfaces. Such fascinating adhesion evoked an inspiration for a synthetic elastomeric gecko pad. The research on synthetic gecko pad resulted in many follow-up studies on dry fibril adhesives, such as contact splitting and crack trapping, adhesion controllability, self-cleaning property, hierarchical structuring, multi-material composite fibrils, adhesion with any liquid super-repellency, adhesion to skin, soft robotic grippers, and robotic wall climbers.

The adhesion strength of synthetic gecko fibril arrays is studied typically on smooth surfaces, and it is a function of the size and shape of the fibril tip and stem in addition to the fibril density, fibril elastomeric material properties, and the fibril array backing layer. For a single fibril, the adhesion strength is especially sensitive to the geometry of the fibril structure. It is found that the tip geometry is crucial to the adhesion improvement, where bioinspired mushroom-shaped and T-shaped fibril tips improved the adhesion strength notably greater than the one from simple flat-punch fibrils. Also, multiple optimal mushroom- and T-shaped tip geometries have been proposed.

Limitations arise when optimizing such previously proposed tip shapes due to the nature of the current template-based design approach. Such approach is based on a pre-determined T-shaped or mushroom-shaped tip with a cylindrical stem, and suppresses the chances to explore and find out-of-the-box optimal tip and stem shapes.

For this reason, it is an object of the invention to provide a method of making one or more fibrils that results in improved fibril designs having a higher adhesion force than prior art fibrils of the same material. It is yet a further object of the invention to reduce the time period of manufacture and designing such fibrils.

This object is satisfied by the subject matter of the independent claims.

A method of making one or more fibrils, the method comprising the steps of:

- providing a material of manufacture of the one or more fibrils;
- providing a random initial shape of the one or more fibrils, with each fibril of the one or more fibrils comprising several surfaces;
- calculating an adhesive force of the one or more fibrils based on the material of manufacture of the one or more fibrils and on the provided random initial shape of the one or more fibrils, i.e. of their several surfaces;
- adapting, in particular iteratively adapting, the random initial shape of the one or more fibrils to vary the adhesive force of the one or more fibrils to form resultant shapes of the one or more fibrils and determining the corresponding adhesive force for each resultant shape of the one or more fibrils;
- selecting the resultant shape of the one or more fibrils having the highest adhesive force of the one or more fibrils; and
- producing one or more fibrils having the selected resultant shape having the highest adhesive force of the one or more fibrils.

In this way synthetic elastomeric dry microfibrillar adhesives can be created for a wide range of applications the fibers or arrays of fibers having the following unique properties, they are: residue-free, repeatable, tunable, controllable and silent adhesion; self-cleaning property; and breathability.

In contrast to the prior art where the design of such dry fibrillar adhesives is limited by a template-based design approach using a pre-determined bioinspired T-shaped or wedge-shaped mushroom tips, the present disclosure not only allow to vary the material of the fibrils, but also varies the shape and size of the fibrils in order to obtain fibrils of a given material having improved adhesion characteristics.

In this connection it should be noted that the step of adapting the initial random shape of the fibrils may take place a plurality of times, where each consecutive step may be based on the previous step. That is, the various adapting steps can be based on one another. Hence, the adapting of the initial—and therefore also the resultant shape—can also take place a plurality of times until the determined corresponding adhesive force of the resultant shapes converges.

The initial shape of the one or more fibrils may comprise an axisymmetric shape having an at least locally flat tip surface at an end thereof and the profile of the one or more fibrils are defined by a set of parameterizable curves, such as Bezier curves, spline curves, or polynomial curves.

This means that the initial shape can be an arbitrarily shaped fibril having no pre-defined specific shape. It may have a predefined shape such as one of a cylindrical shaped fibril, a T-shaped fibril, a mushroom shaped fibril, a wedge shaped fibril or the like. Preferably a shape is initially selected that has previously exhibited acceptable adhesion force characteristics. The profile of this shape is then varied in order to obtain the ideal shape for a given material and size of fibril.

The step of calculating the adhesive force of the one or more fibrils may take place by means of a computer implemented simulation. In this way the designing of the fibrils can be sped up significantly.

The normal stress occur at the interface determines the critical point of the separation between the fibril(s) and the object to be attached and the surface integral of the normal stress at the bottom of the stem of the fibril becomes the simulated adhesion. The calculation of the adhesion follows the standard finite element method and may be based on Cauchy's equations.

Thus, the method proposed herein teaches a machine learning (ML)-based computational design approach, where the 3D tip and stem shape of an adhesive fibril is searched in a broad design space and adapted automatically at a given fibril diameter scale and for a given material.

ML-based design optimizations have been widely used in various areas, such as optimal antenna design, composite design, mechanical property prediction, polymer dielectrics, aircraft airfoil design, mechanical structure design, and energy materials. Most of these studies rely on approximate models of finite-element-method (FEM)-based simulations by training artificial-neural-networks (ANNs) in order to accelerate the simulation evaluations. Improved evaluation speed of the approximated models makes the global optimization methods, such as genetic algorithms, feasible. However, the main drawbacks of such approach are high computational time and cost to create the training dataset for the ANNs and lower accuracy due to the approximation process.

In the present teaching a ML-based adhesive fibril design method with a data-efficient optimization framework and accurate FEM-based adhesion mechanics simulations is proposed. By employing a state-of-the-art global optimization method, Bayesian optimization, with comprehensive finite-element-method (FEM)-based adhesion mechanics simulations, the method produces optimal shapes of fibrils, which outperform previous adhesive fibril designs in both simulations and experiments.

Compared to a recently proposed machine learning approach, this disclosure provides the first experimental validation of fibrils designed by machine learning methods together with in-depth stress analyses. In addition, the proposed method is much more data efficient to generate a sub-optimal design in a reasonable duration (~3 hours for each design in this study) and flexible for the changes in the simulation, where the governing physics of the simulation could be readily changed without any prior training of a model, allowing the creation of different adhesive fibrils with other adhesion mechanisms, such as suction. Finally, the method also optimizes the fibril 3D stem shape and deformation in addition to the tip shape, which is ignored in almost all previous template-based and in the previous machine learning-based fibril optimization method.

The step of adapting the initial shape of the one or more fibrils may take place a plurality of times, i.e. iteratively to obtain a wide parameter range from which to select the desired fibrils. In this connection it should be noted that the plurality of times may be selected between 2 and 1000000 iterations, in particular between 5 and 100000 iterations.

In some embodiments the step of adapting the initial shape of the one or more fibrils may take place until the determined adhesive forces of the resultant shapes converge, i.e. until the determined adhesive forces do not vary significantly anymore.

The step of adapting the initial shape of the one or more fibrils takes place by varying the smallest edge radius of the fibril tip with a size selected in the range of 1 nm to 10 μm. In this way the proposed method also takes into account real fabrication methods of the fibrils, i.e. the, preferably outer, shape and size may be determined by the fabrication process of the one or more fibrils. This is in stark contrast to the prior art where the edges are assumed to be of perfect 90° angles and hence leads to a distortion of the internal stresses of the fibrils.

The step of adapting the initial shape of the one or more fibrils may also take place by means of a computer implemented simulation. In this way the designing of the fibrils can be sped up significantly.

The shape adaptation may be based on probabilistic optimization methods, such as Bayesian optimization, which maximizes the objective function value, the adhesion of the one or more fibrils, while keeping the number of required finite element method (FEM) simulation evaluation low.

The step of producing the one or more fibrils may take place by means of at least one of additive manufacturing, two-photon polymerization, 3D printing, optical lithography, electron-beam lithography, focused ion beam machining, laser micro/nanomachining, mechanical or ultrasound micromachining, micro/nanoprinting, roll-to-roll replication, injection molding, compression molding, and polymer casting.

In this connection it should be noted that the fibrils can be formed directly at a backing substrate made of the same or a different material from the material of the one or more fibrils.

The material of manufacture of the one or more fibrils may be selected from the group of members consisting of organic, inorganic, polymers, rubbers, silicones, polyurethanes, biomaterials, biopolymers, composites, elastomers, liquid crystalline elastomers, thermoplastic elastomers, foams, fabric materials, particle materials, fibrous materials, or combinations of the foregoing. In this connection it is noted that the, preferably soft, material of the fibrils is preferably an elastomer, such as PDMS or a polyurethane elastomer.

It is preferred that the fibrils and/or the backing substrate further comprise a filler material selected from the group of members consisting of organics, inorganics, metals, alloys, ceramics, glass, polymers, rubbers, biomaterials, hydrogels, liquid materials, phase changing materials, composites, foams, fabric materials, particle materials, fibrous materials, micro- and nanoparticles and combinations of the foregoing. An example for the use of filler materials could be magnetic micro-particles, which enable the material to be movable, or metal particles, which can make the material switchable or electrically conductive so that it could e.g. be used as part of a sensor. It could also be possible to introduce a type of functionalized material in order to give the backing substrate of the one or more fibrils, for example, a further function apart from holding the fibrils together.

Thus, for example electrodes could form the backing substrate that then adheres to a patient's skin via the fibrils to make wearable medical devices.

The material of manufacture of the one or more fibrils may have a Young's modulus selected in the range of 0.01 to 10000 MPa, where the Young's modulus could be measured via tensile stress tests. Such comparably soft materials are well suited to be used for a wide range of adhesive applications in robotics, transfer printing, closures, consumer products, and medical devices etc.

In order to measure the Young's modulus of a material, tensile stress testing can be done with a commercial universal tensile testing machine such as an Instron tensile tester. Tensile testing, also known as tension testing, is a test, in which a material sample is subjected to a controlled tension until failure. The properties that are directly measured via a tensile test are ultimate tensile strength, breaking strength, maximum elongation and reduction in area. From these measurements—among other things—the Young's modulus can be determined.

The test process involves placing the test specimen in the tensile testing machine and slowly extending it until it fractures. During this process, the elongation of the gauge section is recorded against the applied force. The data can be manipulated such that it is no longer specific to the geometry of the test sample. The elongation measurement is used to calculate the engineering strain, ε, using the following equation:

$$\varepsilon=\Delta L/L_0=(L-L_0)/L_0$$

wherein ΔL is the change in gauge length, $L_0$ is the initial gauge length, and L is the final length. The force measurement is used to calculate the engineering stress, σ, using the following equation:

$$\sigma=F_n/A$$

wherein F is the tensile force and A is the nominal cross-section of the specimen.

The Young's modulus can then be calculated via the following equation:

$$E\leq\sigma/\varepsilon.$$

The method may further comprise the step of designing the fibril tip edge by defining a radius of curvature between one or more surfaces of the one or more fibrils.

The method may further comprise the steps of:

- providing a boundary interface to which the one or more fibrils are attachable,
- defining a material of the boundary interface; and
- calculating an interfacial stress between the one or more fibrils and the boundary interface.

In this way the adhesion force at the boundary interface can be calculated in advance resulting in even more improved adhesion characteristics of the one or more fibrils to predefined surfaces.

The step of calculating an interfacial stress between the one or more fibrils and the boundary interface may take place by means of a computer implemented simulation.

The interfacial stress may be calculated directly by the Cauchy's equilibrium equations when the fibril in the simulation is gradually stretched. When the maximum stress at the interface exceeds the interfacial strength between the fibril material and the object material, which is measured experimentally.

According to a further aspect the present invention also relates to a computer implemented method of simulating an adhesive force of one or more fibrils to produce fibrils with an increased adhesive force, the method comprising the steps of:

- defining a material of manufacture of the one or more fibrils;
- defining an initial shape of the one or more fibrils, with each fibril of the one or more fibrils comprising several surfaces;
- calculating by means of the computer an adhesive force of the one or more fibrils based on the material of manufacture of the one or more fibrils and on the defined initial shape of the one or more fibrils;
- iteratively adapting the initial shape or a shape determined in the previous adapting step or a previously determined shape having the highest adhesive force so far of the one or more fibrils a plurality of times to vary the adhesive force of the one or more fibrils to determine the resultant shapes of the one or more fibrils and calculating the corresponding adhesive force of each resultant shape of the one or more fibrils;
- selecting the determined resultant shape of the one or more fibrils having the highest adhesive force of the one or more fibrils; and
- initiating the production of the one or more fibrils on the basis of the resultant shape with the highest adhesive force of the one or more fibrils.

In this connection the initial shape of the one or more fibrils can be a random initial shape that is arbitrarily selected. It may also be an initial shape that resembles the shape of a previously produced fibril, such as a T-shaped fibril, a wedge shaped fibril, a mushroom shaped fibril and the like.

Thus, a machine learning-based computational approach to optimize designs of adhesive fibrils, exploring a much broader design space is obtained. A combination of Bayesian optimization and finite element methods creates novel optimal designs of adhesive fibrils, which may be fabricated by two-photon-polymerization-based three-dimensional (3D) microprinting and double-molding-based replication out of polydimethylsiloxane (PDMS).

Such optimal elastomeric fibril designs outperform previously proposed designs by maximum 77% in the experiments in respect of dry adhesion performance on smooth surfaces. Furthermore, finite element analyses reveal that the adhesion of the fibrils is sensitive to the 3D fibril stem shape, tensile deformation, and fibril microfabrication limits, which contrast with the previous assumptions that mostly neglect the deformation of the fibril tip and stem, and focus only on the fibril tip geometry.

In this connection it should be noted that the step of adapting the initial random shape of the fibrils may take place a plurality of times, where each consecutive step may be based on the previous step. That is, the various adapting steps can be based on one another. Hence, the adapting of the initial—and therefore also the resultant shape—can also take place a plurality of times until the determined corresponding adhesive force of the resultant shapes converges.

In this connection it should further be noted that it is common knowledge that any information that is provided to and/or defined by and/or handled by a computer system is usually available as some sort of data set, such as, for example, a sequence of zeros and ones. Thus, it can also be possible that each input and/or output of a computer is given in the form of a data set.

The proposed computational fibril design method is data-efficient and flexible to be combined with other fibril adhesion mechanisms, such as suction and multimaterial-based composite dry fibril adhesion, which could help design future optimal fibrils for specific applications with less help from human intuition.

According to an embodiment of the invention the step of iteratively adapting the initial shape or the previously determined shape or the previously determined shape having the highest adhesive force so far of the one or more fibrils is carried out by varying a smallest edge radius of the surfaces of the one or more fibrils, in particular with said smallest edge radius comprising a size in the range of 1 nm to 10 μm.

According to another embodiment the step of iteratively adapting the initial shape of the one or more fibrils is based on probabilistic optimization methods, such as Bayesian optimization, with the random initial shape in particular being a random $3^{rd}$-order Bezier-curve-based side profile.

It may further be possible that the probabilistic optimization method comprises the step of maximizing an objective function value, i.e. the adhesion of the one or more fibrils, while keeping the number of a required finite element method, FEM, simulation evaluation low, i.e. below 1000 simulation evaluations.

In this connection it should be noted that the optimization method may be defined by $$\max_{x \in A} f(x)$$

where $f(\bullet)$ is the adhesion, in particular calculated from FEM, x is a parameter which constitutes profile curves of a set of parameterizable curves, such as Bezier curves, spline curves, or polynomial curves, and A is a simple set which constitutes a hyper-rectangle of the parameter boundaries of x.

Additionally, it can be possible that f(x) is a Gaussian Processes, GP, which is a collection of random variables such that a joint distribution of every finite subset of random variables is a multivariate Gaussian defined by:

$$f \sim GP(\mu,k), \text{ in particular } f = GP(\mu,k)$$

wherein μ(x) and k(x) are a mean and a covariance function, and wherein the GP surrogates the relationship between the parameter x and f(x) using black-box representation of the adhesion simulated in the FEM.

According to another embodiment of the invention the initial shape of the one or more fibrils comprises an axisymmetric shape having an at least locally flat tip surface at an end thereof and the profile of the one or more fibrils are defined by a set of parameterizable curves, such as Bezier curves, spline curves, or polynomial curves.

According to yet another embodiment the initial shape of the one or more fibrils resembles the shape of a previously produced shape, such as a T-shaped fibril, a wedge-shaped fibril, a mushroom-shaped fibril and/or combinations of the foregoing.

It may further be possible that the surfaces of the one or more fibrils are arranged such that the initial shape of the one or more fibril comprises an axisymmetric shape having an at least locally flat tip surface at an end thereof and the profile of the one or more fibrils are defined by a set of parameterizable curves, such as Bezier curves, spline curves, or polynomial curves.

The surfaces of the one or more fibrils may also be arranged such that the initial shape of the one or more fibrils resembles the shape of a previously produced shape, such as a T-shaped fibril, a wedge-shaped fibril, a mushroom-shaped fibril and/or combinations of the foregoing.

According to another embodiment the step of calculating the adhesive force of the one or more fibrils is carried out by standard finite element method.

In this connection it should be noted that the standard finite element method may be based on Cauchy's equation.

It may further be possible that the step of adapting the initial shape of the one or more fibrils takes place a plurality of times with the plurality of times being selected between 2 and 1000000 iterations, i.e. iteratively.

According to an embodiment the adapting the initial shape of the one or more fibrils stops when the calculated adhesive forces of the resultant shapes of the one or more fibrils converge.

According to a further embodiment the material of manufacture of the one or more fibrils is selected from the group of members consisting of organic, inorganic, polymers, rubbers, silicones, polyurethanes, biomaterials, biopolymers, composites, elastomers, liquid crystalline elastomers, thermoplastic elastomers, foams, fabric materials, particle materials, fibrous materials, or combinations of the foregoing. In this connection it is noted that the soft material is preferably an elastomer, such as PDMS, a silicone elastomer, vinylsiloxane, or a polyurethane elastomer.

In this connection it should be noted that the material of manufacture of the one or more fibrils may have a Young's modulus selected in the range of 0.01 to 10000 MPa.

According to a further embodiment of the invention the computer implemented method further comprises the step of designing the fibril tip edge by defining a radius of curvature between the surfaces of the one or more fibrils.

According to another embodiment the computer implemented method further comprises the steps of: defining a boundary interface to which the one or more fibrils are attachable, defining a material of the boundary interface; and calculating an interfacial stress between the one or more fibrils and the boundary interface.

In this connection it should be noted that the interfacial stress may be calculated by the Cauchy's equilibrium equations.

According to a further aspect the present invention also relates to a fibril obtainable by a method of making the one or more fibrils and/or simulated by the computer implemented method, the fibril optionally having at least one of an adhesive force selected in the range of 0.000001 mN to 1000 mN, a shape selected from the group of members comprising a profile composed of freeform curves; and interfacial stress to a boundary surface selected in the range of 0.001 kPa to 10000 MPa and a material selected from the group of members consisting of organic, inorganic, polymers, rubbers, silicones, polyurethanes, biomaterials, biopolymers, composites, elastomers, liquid crystalline elastomers, thermoplastic elastomers, foams, fabric materials, particle materials, fibrous materials, or combinations of the foregoing.

Such fibril designs can be used for a wide range of adhesive applications in robotics, transfer printing, closures, consumer products, and medical devices etc.

Further embodiments of the invention are described in the following description of the Figures and/or the dependent claims attached to this specification. The invention will be explained in the following in detail by means of embodiments and with reference to the drawing in which is shown:

FIGS. 1A to D design and fabrication process of the machine learning-based design of fibrils (MLFs) for maximal adhesion on smooth flat surfaces;

FIGS. 2A to B adhesion performance results in simulations and experiments;

FIGS. 3A to C stress profile changes by the fibril stretch in FEM simulations for a 70 μm-diameter MLFn;

FIGS. 4A & B sensitivity analysis of adhesion as a function of the fabrication constraint and the stem shape in FEM simulations;

FIG. 5 fitting the previously proposed ML-based optimal fibril design using a $4^{th}$-order Bezier curve, for modeling the fibril geometry, the fitted Bezier curve shows $R^2$ value of 0.9999;

FIG. 6. simulated maximum adhesion values of the optimal $MLF_n$ fibrils as a function of the order of the fitting Bezier curves;

FIGS. 7A & B SEM images of the reference fibrils and MLFs (A: together with all three fibrils; B: zoomed images);

FIGS. 8A to D representative force-displacement curves of the fabricated PDMS fibrils (different tip diameters, A: 30 μm; B: 50 μm; C: 70 μm; D: 90 μm) on a smooth spherical glass probe with 8 mm-diameter;

FIG. 9 simulated adhesion comparison with a state of the art fibril;

FIG. 10A to C stress profile change by strain of an $MLF_v$ (70 μm diameter), when the fibril is stretched by a small amount (A: 25% strain), the peak stress occurs at the edge. However, when the fibril is stretched by a large amount (B: 100% strain), the normal peak stress occurs at the center, rather than the edge, similar to $MLF_n$'s case (C, FIG. 3);

FIG. 11 adhesion sensitivity analysis on the tip size of 70 μm-diameter $MLF_n$;

FIGS. 12A & B interfacial stress profiles at the detachment of the design variants of $MLF_n$;

FIG. 13 adhesion sensitivity analysis on the tip curvature of 70 μm-diameter $MLF_n$;

FIG. 14. a representative force-time curve of $MLF_n$ with 70 μm tip diameter; and FIG. 15 process of the Bayesian optimization in case of 70 μm-diameter $MLF_n$.

In the following the same reference numerals will be used for parts having the same or equivalent function. Any statements made having regard to the direction of a component are made relative to the position shown in the drawing and can naturally vary in the actual position of application.

The present invention relates to a method of making one or more fibrils 10 (see FIG. 1A). In an initial step a desired material of manufacture of the one or more fibrils 10 is selected. For example, the material of manufacture of the one or more fibrils 10 is selected from the group of members consisting of organic, inorganic, polymers, rubbers, silicones, polyurethanes, biomaterials, biopolymers, composites, elastomers, liquid crystalline elastomers, thermoplastic elastomers, foams, fabric materials, particle materials, fibrous materials, or combinations of the foregoing. In this connection it is noted that the soft material is preferably an elastomer, such as PDMS or a polyurethane elastomer.

It is preferred that the fibrils 10 and/or a backing substrate 24 (see FIG. 1C) further comprise a filler material selected from the group of members consisting of organics, inorganics, metals, alloys, ceramics, glass, polymers, rubbers, biomaterials, hydrogels, liquid materials, phase changing materials, composites, foams, fabric materials, particle materials, fibrous materials, micro- and nanoparticles and combinations of the foregoing. An example for the use of filler materials could be magnetic micro-particles, which enable the material to be movable, or metal particles, which can make the material switchable or electrically conductive so that it could e.g. be used as part of a sensor. It could also be possible to introduce a type of functionalized material in order to give the backing substrate, for example, a further function apart from holding the fibrils together.

Following the selection of the material, a random initial shape of the one or more fibrils 10 is selected. This initial shape of the one or more fibrils 10 comprises an axisymmetric shape having an at least locally flat tip surface at an end thereof and the profile of the one or more fibrils 10 are defined by a set of parameterizable curves, such as Bezier curves, spline curves, or polynomial curves. By way of example, the fibrils 10 shown in FIG. 1D show such a fibril shape having a tip 28, a stem 26 and an edge 30. Such fibril shapes may be T-shaped, punch shaped, wedge shaped, mushroom shaped, arrow shaped, and mixed shaped fibrils.

Thereafter, an adhesive force of the one or more fibrils 10 is calculated. This adhesive force is based on the material of manufacture of the one or more fibrils 10 and on the initial shape of the one or more fibrils 10. The calculation of the adhesive force of the one or more fibrils 10 takes place by means of a computer implemented simulation.

This computer implemented simulation is based on the normal stress that occurs at the interface and that determines the critical point of the separation between the fibril(s) 10 and an object to be attached and the surface integral of the normal stress at the bottom of the stem of the fibril 10 becomes the simulated adhesion. The calculation of the adhesion is based on the standard finite element method which follows Cauchy's equations of equilibrium as $$\frac{\partial\sigma_{xx}}{\partial x_1}+\frac{\partial\tau_{xy}}{\partial x_2}+\frac{\partial\tau_{xz}}{\partial x_3}+F_x=0$$

$$\frac{\partial\tau_{xy}}{\partial x_1}+\frac{\partial\sigma_{yy}}{\partial x_2}+\frac{\partial\tau_{yz}}{\partial x_3}+F_y=0$$

$$\frac{\partial\tau_{xz}}{\partial x_1}+\frac{\partial\tau_{xz}}{\partial x_2}+\frac{\partial\sigma_{zz}}{\partial x_3}+F_z=0$$

where $\sigma_{xx}$, $\sigma_{yy}$, $\sigma_{zz}$ are normal stresses and $\tau_{xy}$, $\tau_{yz}$, $\tau_{xz}$ are shear stresses on an infinitesimal cube in x-, y-, and z-directional normal surfaces; $x_1$, $x_2$, $x_3$ are coordinate system; and $F_x$, $F_y$, $F_z$ are the body forces acting on the infinitesimal cube. The calculation of the equation could be performed using a weighted residual method in weak formulation.

The calculation of the adhesion is further processed from the stress calculations from above. The stresses calculated from the Cauchy's equations of equilibrium provide the interfacial stress between the fibril of interest and the adhesion interface. The integration of the normal stress along the interface or along the root (base and/or stem) of the fibril becomes the adhesion force of the fibril during the stretch of the fibril. When the normal stress at the interface exceeds the interfacial strength of the interface, the adhesion force at that moment becomes the adhesion of the fibril. The calculation of these could be formulated in commercial finite element analysis tools.

In order to carry out this step of adaption reliably the initial shape of the one or more fibrils 10 is adapted between 5 and 1000000 iterations.

Specifically, the step of adapting the initial shape of the one or more fibrils 10 takes place by varying the smallest edge radius of the fibril tip with a size selected in the range of 1 nm to 10 μm. This shape and size may be determined by the fabrication process of the one or more fibrils 10. For example, if the fibrils 10 are cast in a mold, then the radius may be of the order of 500 to 10000 nm, whereas fibrils 10 produced e.g. by means of polymer casting may have a radius of 500 nm to 10 μm and fibrils 10 produced e.g. by means of electron-beam lithography may produce fibrils with radii in the range of 1 nm to 5 μm.

The method may further comprise the step of designing the fibril tip edge by defining a radius of curvature between one or more surfaces of the one or more fibrils.

In this connection it should be noted that the representation of the profile may be performed in a parameterized vector representation. Because of vectorized representation of the profile, the designed profile is not subject to the resolution of the design system. By changing the parameters of the profile, the profile could be further adapted, where the optimal trials of the parameters are given by the Bayesian optimizer.

Thereafter, the shape and size of the random initial shape of the one or more fibrils 10 is adapted, i.e. varied in order to maximize the adhesive force of the one or more fibrils 10 to form resultant shapes of the one or more fibrils 10.

This step of adapting the initial shape of the one or more fibrils 10 also takes place by means of a computer implemented simulation. In order to carry out this step of adaption reliably the initial shape of the one or more fibrils 10 is adapted between 5 and 1000000 iterations in order to obtain different adhesives forces for the different fibril shapes.

The shape adaptation is based on probabilistic optimization methods, such as Bayesian optimization, which maximizes the objective function value, the adhesion of the one or more fibrils 10, while keeping the number of required finite element method (FEM) simulation evaluation low. The optimization process solves the general optimization represented as $$\max_{x \in A} f(x)$$

where $f(\cdot)$ is the adhesion calculated from FEM, x is the parameter which constitutes the profile curves of the set of parameterizable curves, such as Bezier curves, spline curves, or polynomial curves, A is a simple set which constitutes a hyper-rectangle of the parameter boundaries of x.

The $f(x)$ is represented by Gaussian Processes (GP) which is a collection of random variables such that the joint distribution of every finite subset of random variables is multivariate Gaussian:

$$f \sim GP(\mu, k), \text{ in particular } f = GP(\mu, k)$$

where $\mu(x)$ and $k(x)$ are the mean and covariance function. The GP surrogates the relationship between the parameter x and $f(x)$ using black-box representation of the adhesion simulated in FEM. By choosing different kinds of acquisition functions of the Bayesian optimizer, the shape of the fibrils is optimized based on the parameters generated by Bayesian optimizer.

Once the shape has been varied for the one or more fibrils 10 and their respective adhesion force has been simulated, one proceeds to select the resultant shape of the one or more fibrils 10 having the highest adhesive force of the one or more fibrils 10. Also, this step can be implemented in a computer in order to speed up the manufacturing process. Thereby, for a specific material of manufacture that is desired for a specific application of the fibrils 10 the best shape for the desired adhesion force of the fibrils 10 can be selected. For example, the highest adhesion force may be desired for the fibrils 10. Applications may also exist, where a pre-defined adhesion force may be desired at which the fibrils 10 automatically detach from a surface as a kind of pre-determined breaking point.

It should also be noted in this connection that for different sizes of fibrils 10 of the same material different shapes may yield the best adhesion force for the fibrils 10, i.e. smaller fibrils 10 of the same material may have a shape that differs from the shape of larger fibrils 10 of the same material in order to yield the optimum adhesion force for this size and material of fibril 10.

Following the selection of the resultant shape of the one or more fibrils 10, these are produced with the selected resultant shape having the highest adhesive force of the one or more fibrils 10 for the desired material of manufacture.

The step of producing the one or more fibrils takes place by means of at least one of additive manufacturing, two-photon polymerization, 3D printing, optical lithography, electron-beam lithography, focused ion beam machining, laser micro/nanomachining, mechanical or ultrasound micromachining, micro/nanoprinting, roll-to-roll replication, injection molding, compression molding, and polymer casting.

By way of example, the one or more fibrils can be produced using the following method: In a first step a rigid master 12 (see e.g. FIG. 1C) is 3D-printed using two-photon lithography such that the master comprises patterns 14 of a plurality of fibrils, which are supposed to be produced, i. e. the patterns 14 of the plurality of fibrils comprise the same outer shape as the produced fibrils 10 at the end of the manufacturing process, e.g. a double re-entrant shape, a T-shaped, punch shaped, wedge shaped, mushroom shaped, arrow shaped, and mixed shaped fibrils.

In a second step the master 12 including its patterns 14 are first covered with a non-stick coating (not shown) and then with a first soft material 16. Thus, the patterns 14 are replicated with the first soft material 16 in order to produce a negative mold 18 comprising cavities 20 with an inner shape corresponding to the outer shape of the patterns 14, e.g. the double re-entrant shape, T-shaped, punch shaped, wedge shaped, mushroom shaped, arrow shaped, and mixed shaped fibrils of the fibrils to be produced. The first soft material 16 usually comprises a Young's modulus in the range of 10 kPa to 5 MPa. Also, higher values are possible as long as they still lie within a range where the material can be regarded as "soft".

The "non-stick coating" is supposed to reduce the surface energy of the cavities 20 in order to simplify the further step of demolding the master 12 from the first soft material 16 (the mold 18). In commonly known methods for manufacturing double re-entrant shapes out of rigid materials a non-stick coating is not necessary since they can be produced with additive manufacturing processes. Here it is the case that a double re-entrant shape is supposed to be produced out of soft materials, which is why a negative mold 18 is needed.

Therefore, the surface of the master is first activated by providing oxygen molecules to the master. Said oxygen molecules are then illuminated with UV radiation which causes the oxygen to react with, for example, the carbon dioxide in the air to produce ozone. These ozone molecules are able to reach every edge and corner of the patterns to react and activate the surface. In a further step, passivation is initiated by providing a silane, preferably fluorosilane, or another chemical treatment to the activated surface, which can react with the activated surface in order to give it a sensation of a "non-sticky coating", i. e. to help in a further step of demolding the master from the first material.

Another possibility would be to provide an oxygen plasma to the master surface to activate the surface before passivating it with fluorosilane or another chemical treatment.

In another embodiment of the invention, the surface and the patterns of the master are simply covered with a polymer coating. When using this method, a provision of UV radiation is not necessary.

In a further step, regardless of which "coating"-method has been chosen, before the master 12 is demolded, the first soft material 16 is cured since the material 16 is usually in a liquid phase when it is applied to the master 12. Depending on the exact material used for the first soft material 16 and depending on the ambient temperature said curing can be done within 10 minutes, when the temperature is raised to 150° C., within an hour, when the temperature is raised up to 90° C., or can even take up to 48 hours when the temperature is kept at room temperature (example of PDMS with a standard 10:1 monomer to crosslinker ratio). For softer formulations like, for example, a 20:1 ratio room temperature curing takes even longer.

In order to demold the master 12, without destroying it, from the first material 16 it can be mechanically peeled off by using conventional tweezers. Since the surface of the master 12 has been prepared with the activation and passivation steps or with the polymer coating, as described before, it can be peeled off rather easily from the first material 16 without destroying the delicate structures of the cavities 20 or the patterns 14. Other demolding techniques like chemical dissolving may generally be possible depending on the used materials but are nevertheless infeasible since they would destroy the master and make it not reusable.

After the mold 18 is completely separated from the master (which is only possible because of the previous "coating"-steps), first the surface of the mold 18, and especially the cavities 20, are coated by using one of the coating techniques described above (activating/passivating or polymer coating).

Then, vacuum is applied to the cavities 20 in order to remove air (not shown) from the cavities 20. This will help in the next step where the cavities 18 are filled with a second soft material 22. The second soft material 22 can be the same material as the first soft material 16. In general, it is also possible to use different materials, but it has been shown that soft materials for both the first and the second material 16, 22 are preferred since they guarantee the production of the delicate fibril structures. In the depicted case of FIG. 1A, for example, the first and second soft materials 16 and 22 comprise the same base material (PDMS) but comprise different ratios of base material to cross linker material (20:1 for the first material 14 versus 10:1 for the second material 20).

In order to fill the cavities 20 completely, it might be necessary to tilt the negative mold 18 to a certain degree in order to let the second material 22 flow into the cavities 20, especially also in the undercut parts of the cavities 20 (see e. g. FIG. 1B). Usually, as the second material 22 enters the cavities 20, from which the air has been removed, gravity and hydrostatic pressure will ensure that the cavity 20 is filled completely with the second material 22 even if the mold 18 is not tilted that much or not tilted at all.

One possibility would also be to provide the second material 22 at the mold 18 without the second material initially coming into contact with the cavities 20, before applying the vacuum to the mold 18. Then, after the vacuum has been applied, the mold 18 is moved, in particular tilted, relative to the second material such that the second material 22 flows into and completely fills the degassed cavities 20 to form the fibrils within the cavities 20.

In this connection it is noted that it is either possible to only fill the cavities 20 with the second soft material 22 or to cover the whole mold 18 with the material 22 in order to also produce a backing substrate 24, which is supposed to hold the array of fibrils 10 together. Most common techniques use the latter and additionally provide a backing substrate 24. Said backing substrate 24 can have a thickness of about 0.5 to 1 mm or even up to 10 cm. For certain applications it is also possible to attach the backing substrate 24 to a payload (not shown) which is generally not limited in size and dimensions.

The next step comprises curing the second soft material 22 to finally produce the fibrils 10. Optionally some of the cured second material 22 can be kept in order to provide said backing substrate 24. In some embodiments it is also possible to remove the parts of the cured backing substrate 24 with a razor blade or the like (not shown) in order to only keep the fibrils 10 at the end. Furthermore, it could also be possible to first add the backing substrate 24 and then add a third material, which could act as a "new" backing substrate.

Lastly the first soft material 16 is demolded from the second soft material 22 to arrive at the produced fibrils 10 (and optionally the backing substrate 24).

Thus, in summary, for the elastomeric fibrillar surface fabrication, first a two-photon polymerization method was used to 3D-print the master 12 fibril array (patterns 14) on a glass substrate. The master 12 was then fluorosilanized to allow subsequent demolding, and PDMS (first soft material 16) was then cast and cured on the fibril array 14. The negative replica (negative mold 18) was peeled off and fluorosilanized and the subsequent molding 18 yielded a PDMS replica of the original master 12. A softer PDMS composition (20:1 monomer to crosslinker ratio) for the negative replica was employed to facilitate demolding of the final replica, for which standard PDMS (second soft material 22) was used (10:1 monomer to crosslinker ratio). The final replicas were characterized as prepared without any further processing.

Examples of the fibrils 10, which can be produced with the above disclosed method are shown in FIG. 2A. One can immediately see that the fibrils 10 comprise an axisymmetric shape having an at least locally flat tip surface at an end thereof. Each fibril 8 comprises a fibril body 26 and a fibril tip 28. If a mushroom shaped fibril 10 is desired having the double re-entrant shape then this will comprise an undercut (not shown) at the tip.

The top surface of the tip 28 can be flat and smooth typically. Furthermore, the tip 28 can comprise a side wall with a given height and with a given sharpness and/or curvature at a tip edge that can be determined with the fabrication process resolution.

Said side wall can then comprise an almost 90 degree turn and an undercut cavity under the tip surface. The undercut area combines with the fibril tip 28 at the neck area of the fibril body 26 with a given curvature.

FIGS. 1A to D show steps of the design and fabrication process of the machine learning-based design of fibrils (MLFs) for maximal adhesion on smooth flat surfaces. The right drawing of FIG. 1 shows a fibril 10 having a fibril tip 28 and a body 26.

FIG. 1A shows that the design optimization goal (e.g., maximize adhesion) along with the design constraints is supplied to the Bayesian optimization algorithm. The Bayesian optimizer provides design parameters to the simulator, and the simulator returns the estimated adhesion back using a finite element method (FEM)-based adhesion mechanics simulation. This process runs iteratively until the optimal design is achieved for the fibrils 10.

FIG. 1B shows that the algorithm starts with a random shape and explores the broad design space by controlling Bezier-curve control points to maximize the estimated adhesive force from the FEM simulation for the fibrils 10. In each iteration, a comprehensive FEM simulation from the initial attachment to the detachment is performed. As the iteration number increases (numbers in FIG. 1B), the shape evolves to the best design.

FIG. 1C shows that, after the adapting, i.e. optimization of the shape of the fibrils 10 for the desired application, the best design is fabricated using two-photon polymerization and a subsequent double molding-based replication technique.

FIG. 1D shows the fabricated version of an exemplary optimal fibril design 10 (iteration number 110 at FIG. 1B) is shown in a scanning electron microscope (SEM) image (the scale bar indicates 50 μm). The fibrils are made of polydimethylsiloxane (PDMS) elastomer.

The method may further comprise the steps of:

- providing a boundary interface to which the one or more fibrils 10 are attachable,
- defining a material of the boundary interface; and
- calculating an interfacial stress between the one or more fibrils and the boundary interface.

The step of calculating an interfacial stress between the one or more fibrils and the boundary interface takes place by means of a computer implemented simulation. The interfacial stress is calculated directly by the Cauchy's equilibrium equations denoted above when the fibril 10 in the simulation is gradually stretched. When the maximum stress at the interface exceeds the interfacial strength between the fibril material and the object material, which is measured experimentally.

The present disclosure also relates to a computer implemented method of simulating an adhesive force of one or more fibrils to produce fibrils 10 with an increased adhesive force, the method comprising the steps of:

- providing a material of the one or more fibrils 10;
- providing an initial shape of the one or more fibrils 10;
- calculating by means of the computer an adhesive force of the one or more fibrils 10 based on the material of manufacture of the one or more fibrils 10 and on the initial shape of the one or more fibrils 10;
- iteratively adapting the initial shape of the one or more fibrils 10 a plurality of times to vary the adhesive force of the one or more fibrils 10 to form resultant shapes of the one or more fibrils; and
- selecting the resultant shape of the one or more fibrils 10 having the highest adhesive force of the one or more fibrils 10.

A fibril 10 as obtained by using a method as defined above and/or simulated on the basis of the methods described herein typically has at least one of an adhesive force selected in the range of 0.000001 mN to 1000 mN, a shape selected from the group of members comprising a profile composed of freeform curves, i.e. a fibril 10 having a base 32, a body 26 and a tip 28 that are generally axissysmmetric; and interfacial stress to a boundary surface selected in the range of 0.001 kPa to 10000 MPa and a material selected from the group of members consisting of organic, inorganic, polymers, rubbers, silicones, polyurethanes, biomaterials, biopolymers, composites, elastomers, liquid crystalline elastomers, thermoplastic elastomers, foams, fabric materials, particle materials, fibrous materials, or combinations of the foregoing of polymers.

FIG. 2B shows how the FEM simulation predicts that MLFn has overall superior adhesion performance compared to the other designs. On the contrary, MLFv has lower adhesion than MLFn and T-shaped fibrils suggesting that the design criteria for MLFn is effective to the adhesion improvement than the one of MLFv.

Figure 2:
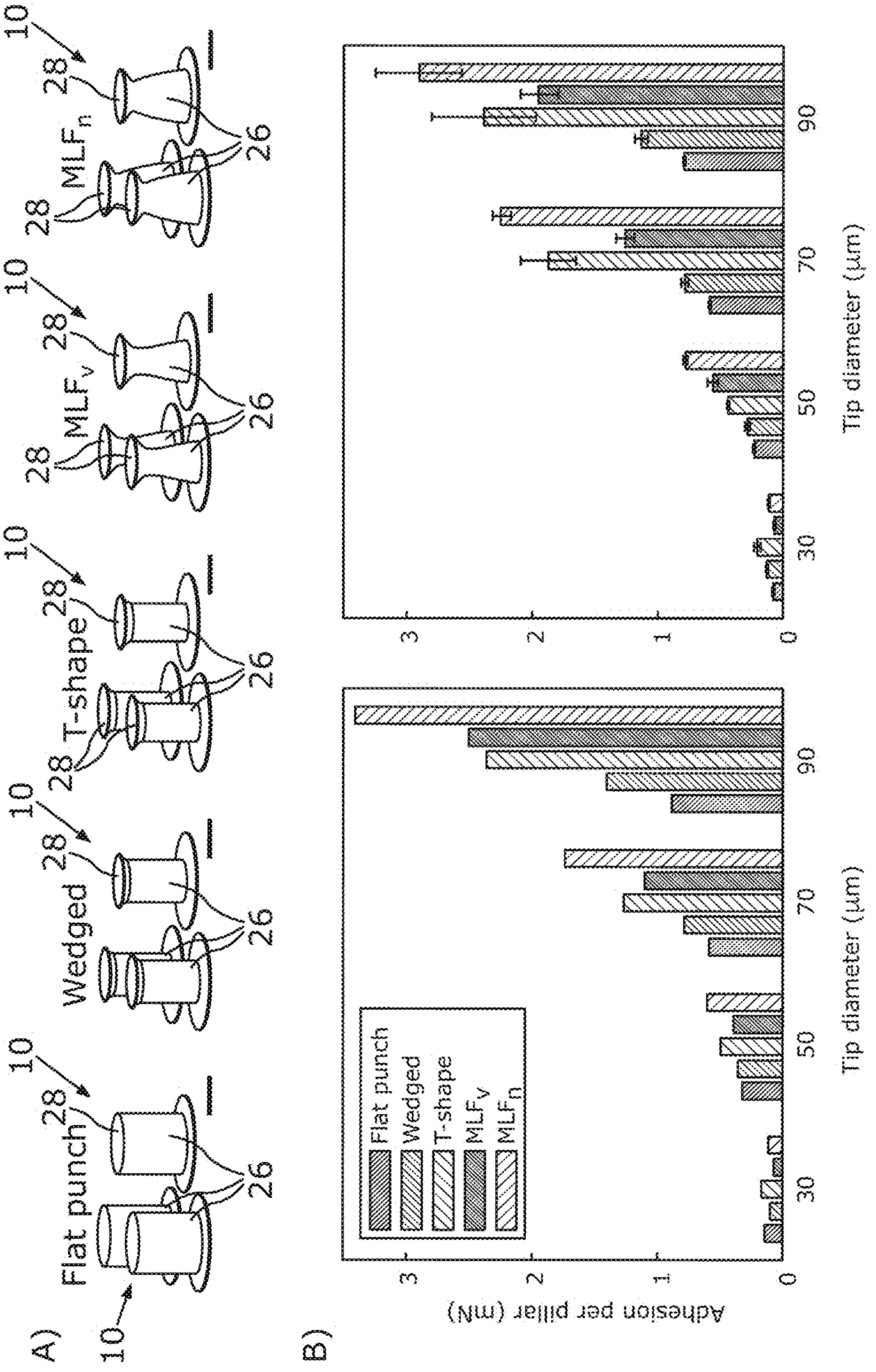
FIG. 2 shows adhesion performance results in simulations and experiments. Examples of fabricated MLFs and reference designs with 70 μm tip diameters are shown in SEM Images as depicted in FIG. 2A (the scale bar indicates 50 μm; fibrils with different diameters are shown in FIG. 7).

FIG. 2C show that the experimental results confirm that the adhesion performance improvement of MLFn and shows an overall agreement between the simulations and experiments. The discrepancy at 70 and 90 μm tip diameters suggests the effect of the curvature of the measurement probe compared to the size of the tip of the fibrils 10, where flat-flat interfacial contact is compromised. The error bars show standard deviations (n=5).

Figure 3:
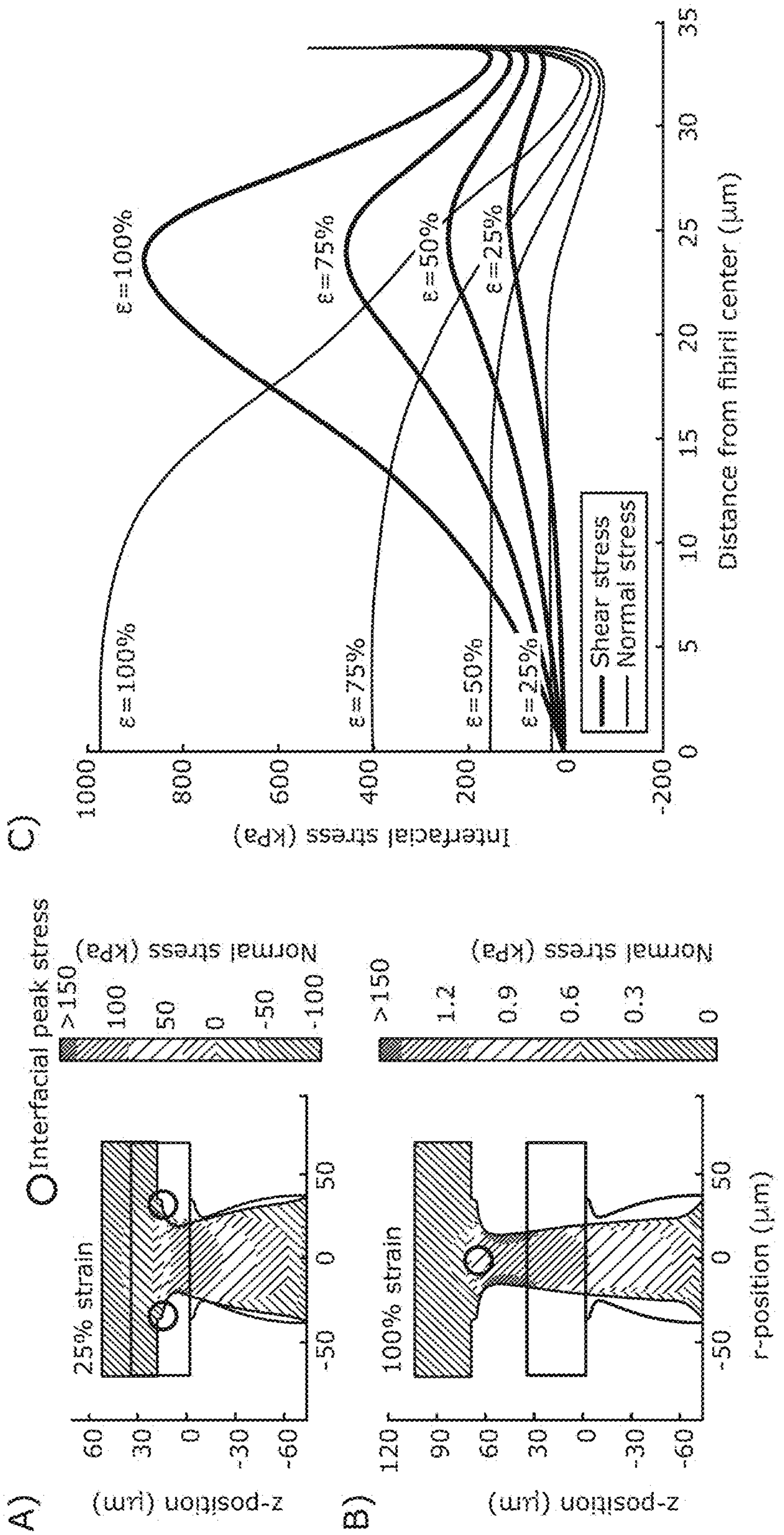

FIG. 3 shows stress profile changes by the fibril 10 stretch in FEM simulations for a 70 μm-diameter MLFn. FIG. 3A shows that when the fibril 10 is stretched by a small amount (25% strain), the peak stress on the fibril tip surface 28 occurs at the tip edge.

FIG. 3B in contrast shows that when the fibril 10 is stretched by a large amount (100% strain), the normal peak stress occurs at the center, rather than the edge. Also, the stress pattern throughout the fibril stem 26 changes indicating that the stem deformation changes the way the stress is transferred to the tip-surface contact interface.

Figure 10:
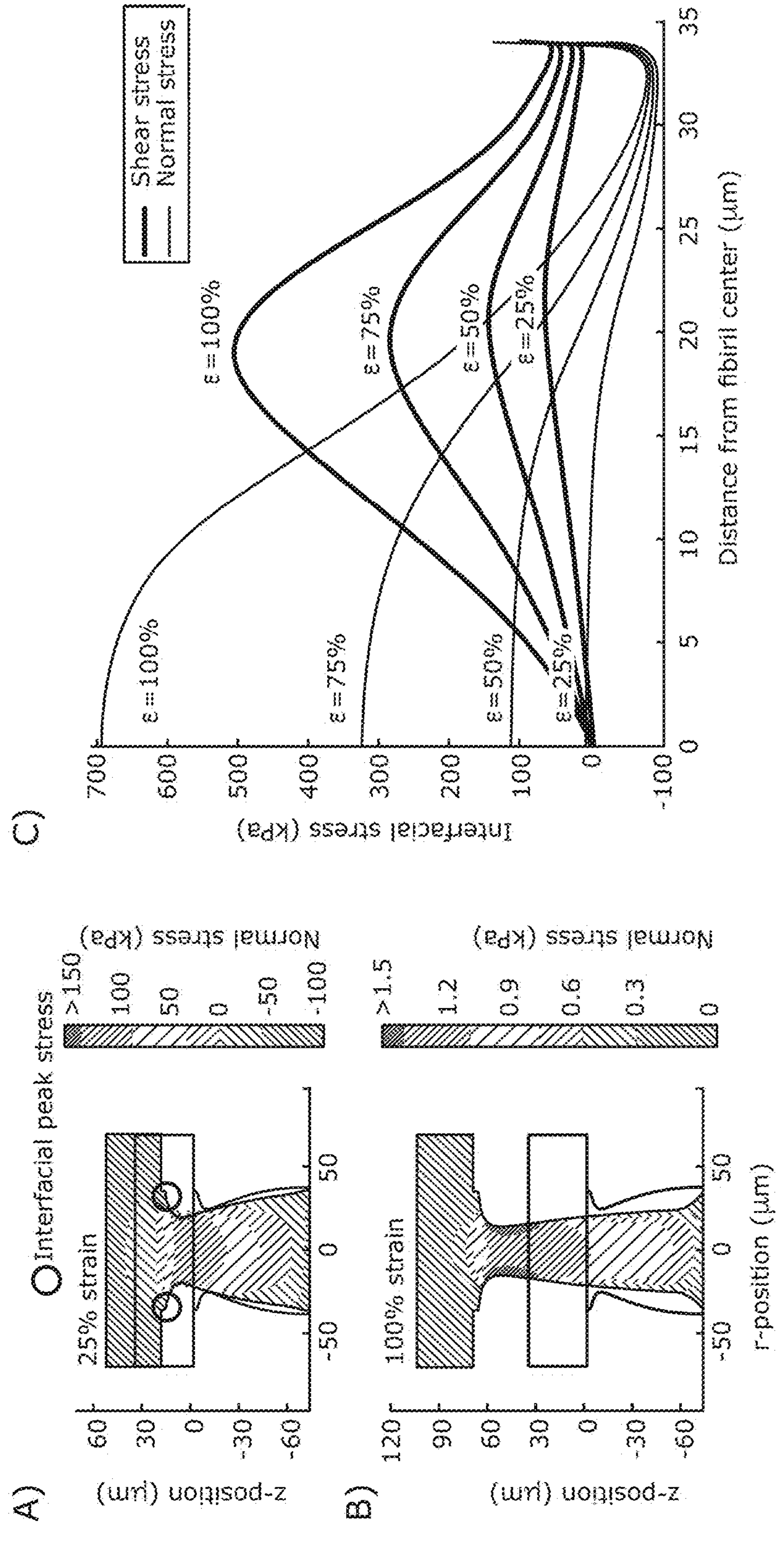

FIG. 3C shows that the evolution of the tip-surface interfacial stress profile explains the change of the peak stress where the stress at the center increases rapidly than the stress at the edge by stretching. Comparable results of MLFv are shown in FIG. 10.

Figure 4:
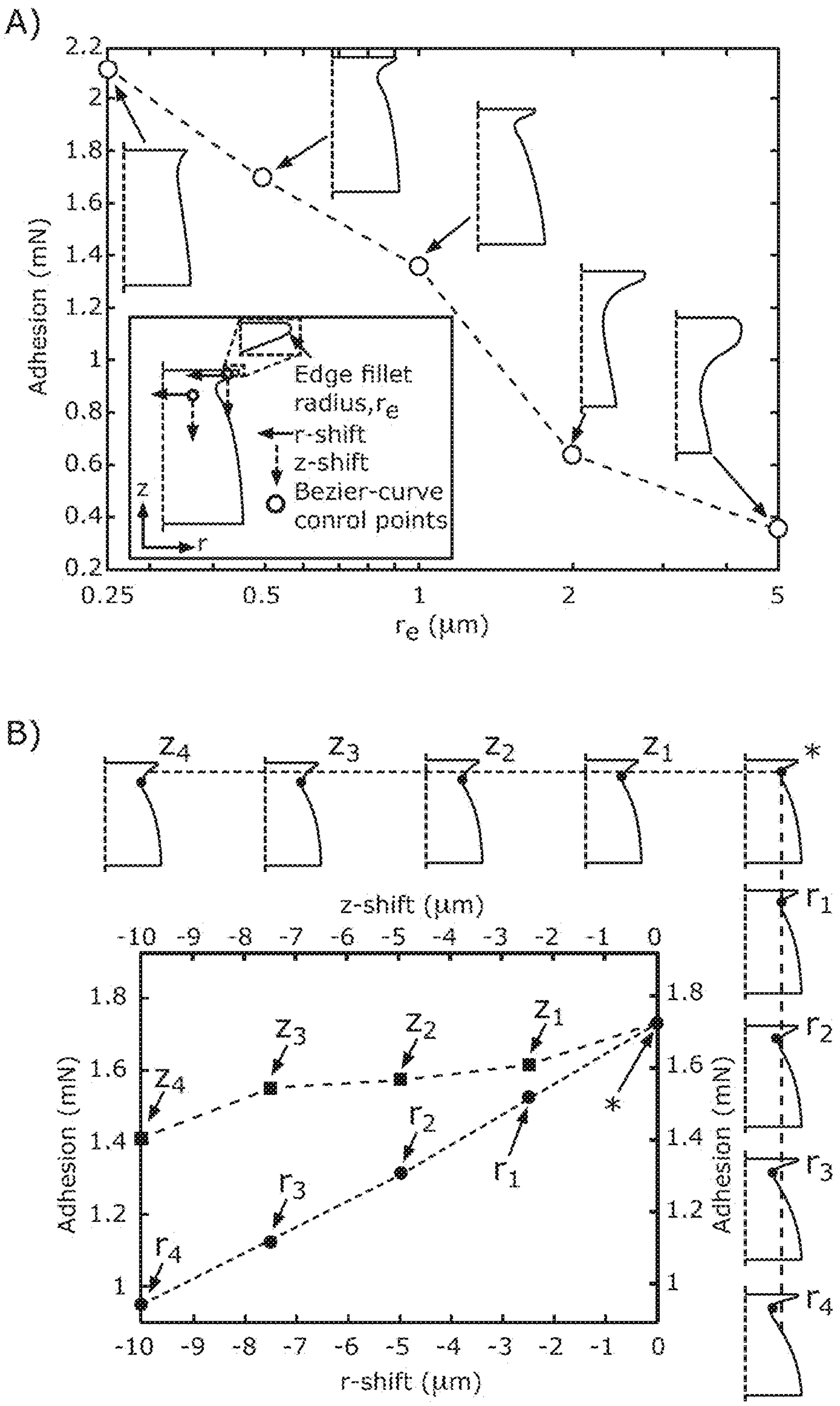

FIG. 4 shows a sensitivity analysis of adhesion as a function of the fabrication constraint and the stem shape in FEM simulations. FIG. 4A shows the optimal design changes by the fabrication constraint, i.e., the tip sharp edge curvature, re. When the fabrication constraint is minute (re=0.25 μm), the predicted optimal design is similar to the wedge-shaped fibrils 10. When the fabrication error is significant to the size of the fibril 10, the optimal fibril shape changes by having a narrow neck and stem. Subsequently, the performance of the fibrils deteriorates with the increased re.

FIG. 4B shows that the stem shape change based on radial control points (r-shift) of the Bezier-curve affects the simulated adhesion performance significantly (blue dashed line with dots). The stem shape change based on axial control points (z-shift) affects the adhesion performance less significantly (red dashed line with squares).

Figure 5:
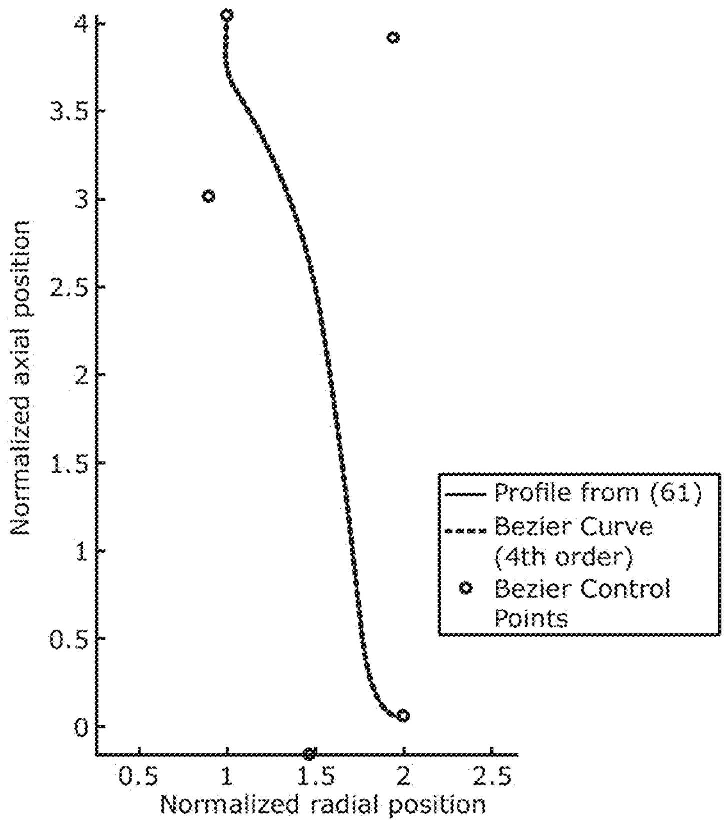

FIG. 5 shows a fitting of the previously proposed ML-based optimal fibril design using a $4^{th}$-order Bezier curve, as used for modeling the fibril geometry, the fitted Bezier curve shows $R^2$ value of 0.9999. Thus, the intrinsic degrees of freedom (DOF) of the previously proposed ML-based optimal fibril design is the same with a $4^{th}$-order Bezier curve.

Figure 6:
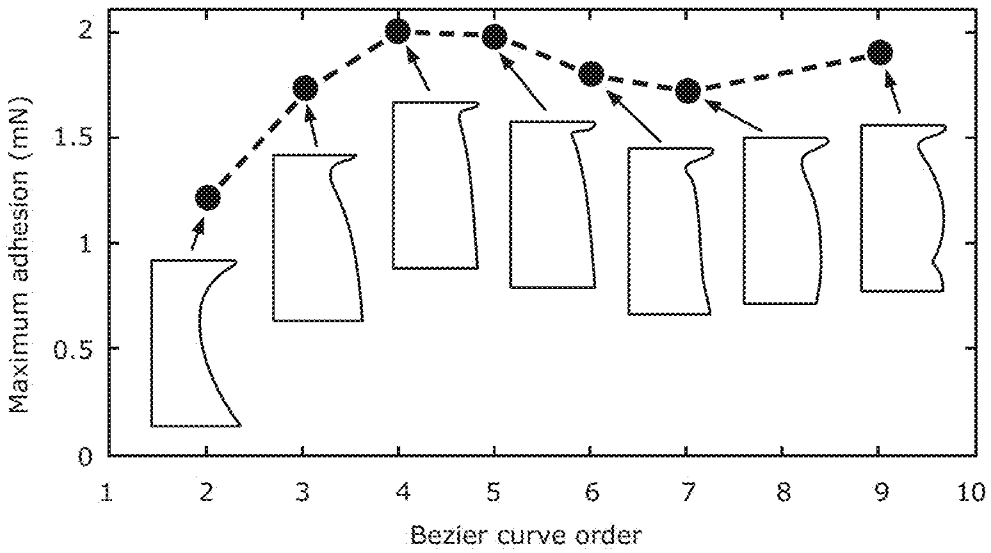

FIG. 6 shows simulated maximum adhesion values of the optimal $MLF_n$ fibrils 10 as a function of the order of the fitting Bezier curves. The adhesion saturates already around $4^{th}$-order Bezier curve fitting, which confirms that the intrinsic DOF of the current fibril design problem is low. Higher order curves show an overfitting behavior.

Figure 7:
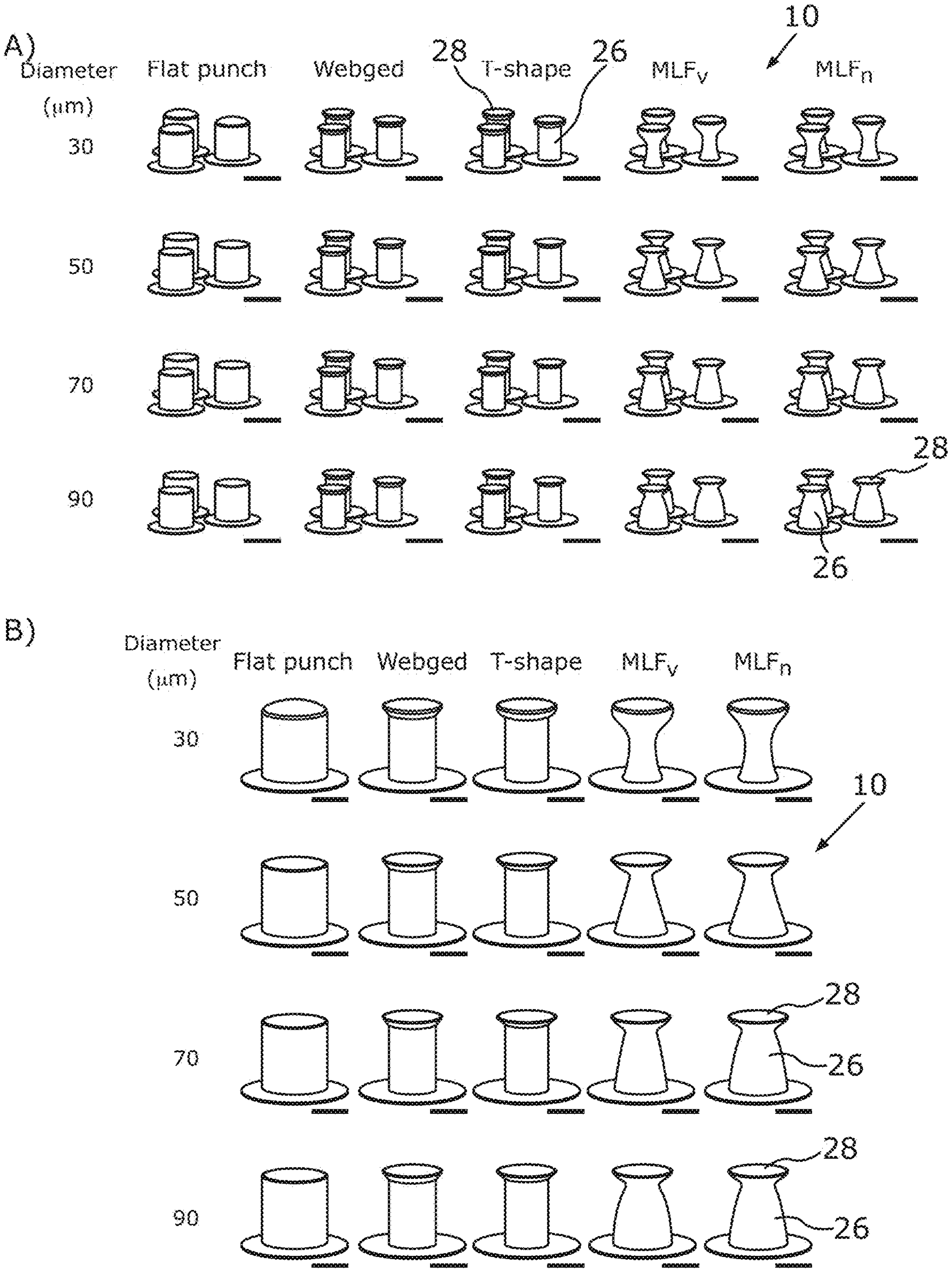

FIG. 7 shows SEM images of the reference fibrils 10 and MLFs (FIG. 7A shows all together with all three fibrils; whereas FIG. 7B shows zoomed images). The scale bars show tip 28 diameters and half of the tip diameters of each size in FIGS. 7A and 7B, respectively.

Figure 8:
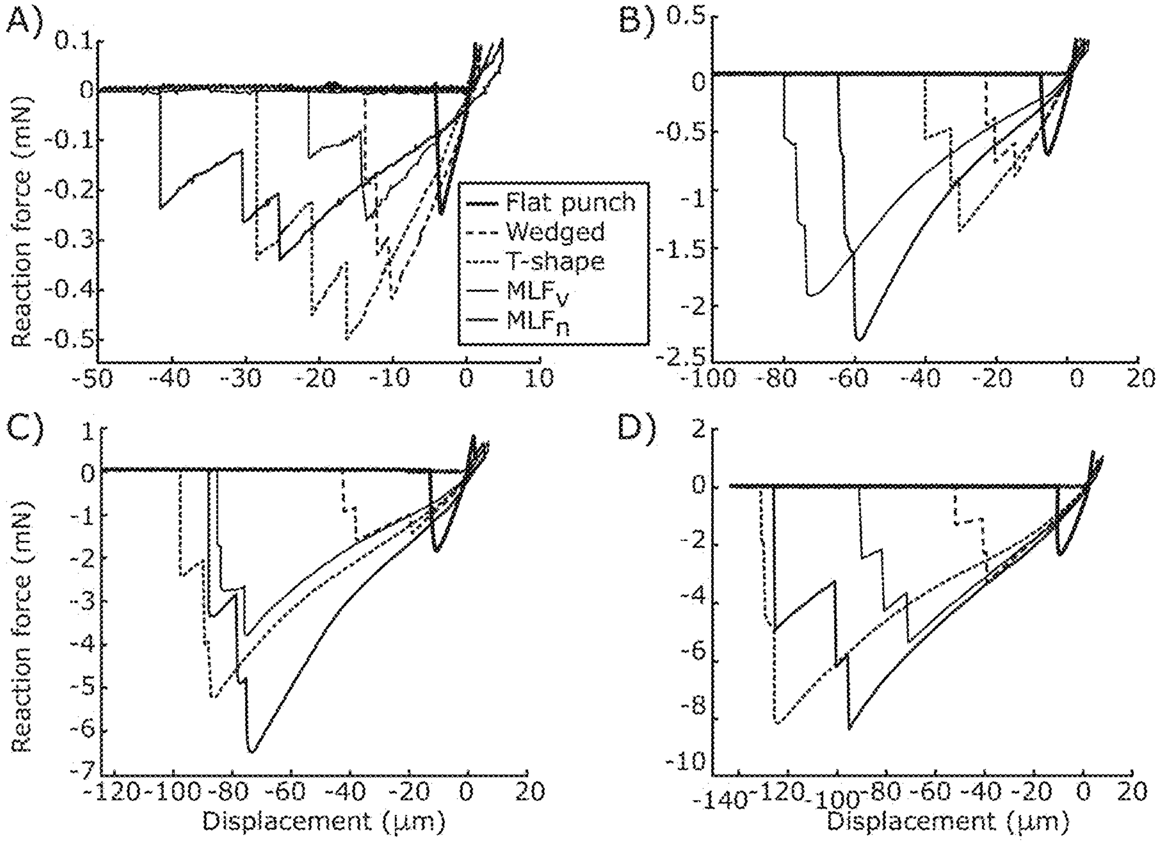

FIG. 8 shows representative force-displacement curves of the fabricated PDMS fibrils 10 for different tip diameters, FIG. 8A: 30 μm; FIG. 8B: 50 μm; FIG. 8C: 70 μm; and FIG. 8D: 90 μm, on a smooth spherical glass probe with 8 mm-diameter. Fibrils 10 with strong adhesion show more than 100% strain exhibiting nonlinear behavior of the material. Individual fibril detachments are observed as three peaks along the force-displacement curves.

Figure 9:
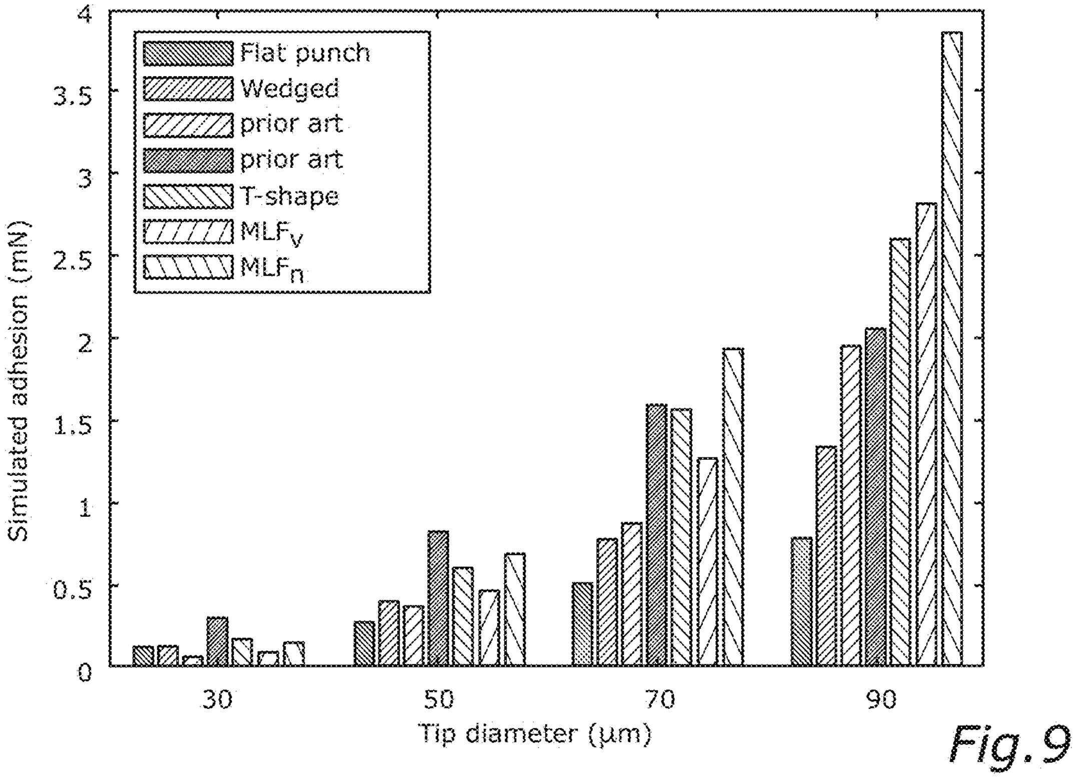

FIG. 9 shows simulated adhesion comparison with the prior art fibrils. Fibrils in (61) show strong adhesion in 30 μm and 50 μm tip diameters assuming nanoscale micro fabrication with sharp edge is possible. In larger scales, such as 70 μm and 90 μm tip diameters, $MLF_n$ fibrils 10 show the strongest adhesion. By applying the same fabrication error as the other pillars to the fibrils 10 of the prior art (rounded edge with 1 μm fillet radius), they show inferior adhesion compared to T-shape and $MLF_n$ fibrils across the all tip diameters in the simulation.

FIG. 10 shows stress profile change by strain of an $MLF_v$ 10 (70 μm diameter). When the fibril 10 is stretched by a small amount (FIG. 10A: 25% strain), the peak stress occurs at the edge. However, when the fibril 10 is stretched by a large amount (FIG. 10B: 100% strain), the normal peak stress occurs at the center, rather than the edge, similar to $MLF_n$'s case (FIG. 10C and FIG. 3). Compared to $MLF_n$ 10 shown in FIG. 3, here the shear stress is reduced, and the effect of such reduced shear was observed in the experiments, resulting in worse/less adhesion (FIG. 2C).

Figure 11:
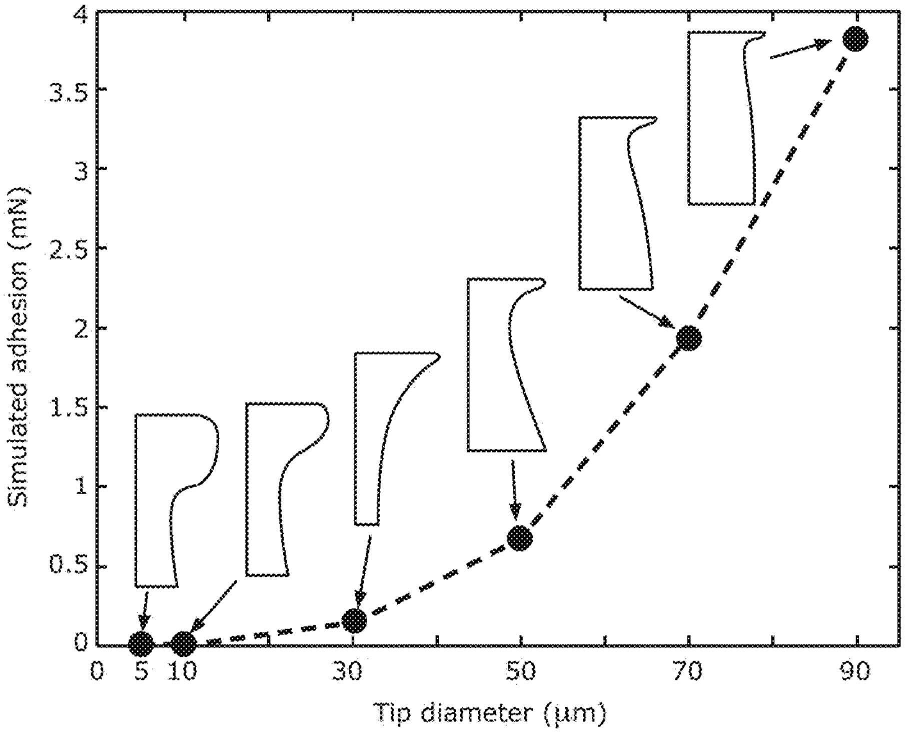

FIG. 11 shows an adhesion sensitivity analysis on the tip size of 70 μm-diameter $MLF_n$ 10. As the tip size gets smaller, the relative fabrication limit becomes significant. The proposed design framework generates various optimal fibril shapes tailored to the fabrication error and the tip sizes, indicating that there is no single universal optimal fibril shape for adhesion across different fibril sizes (and associated fabrication limits). Note that fibrils 10 are not to scale for better visualization.

Figure 12:
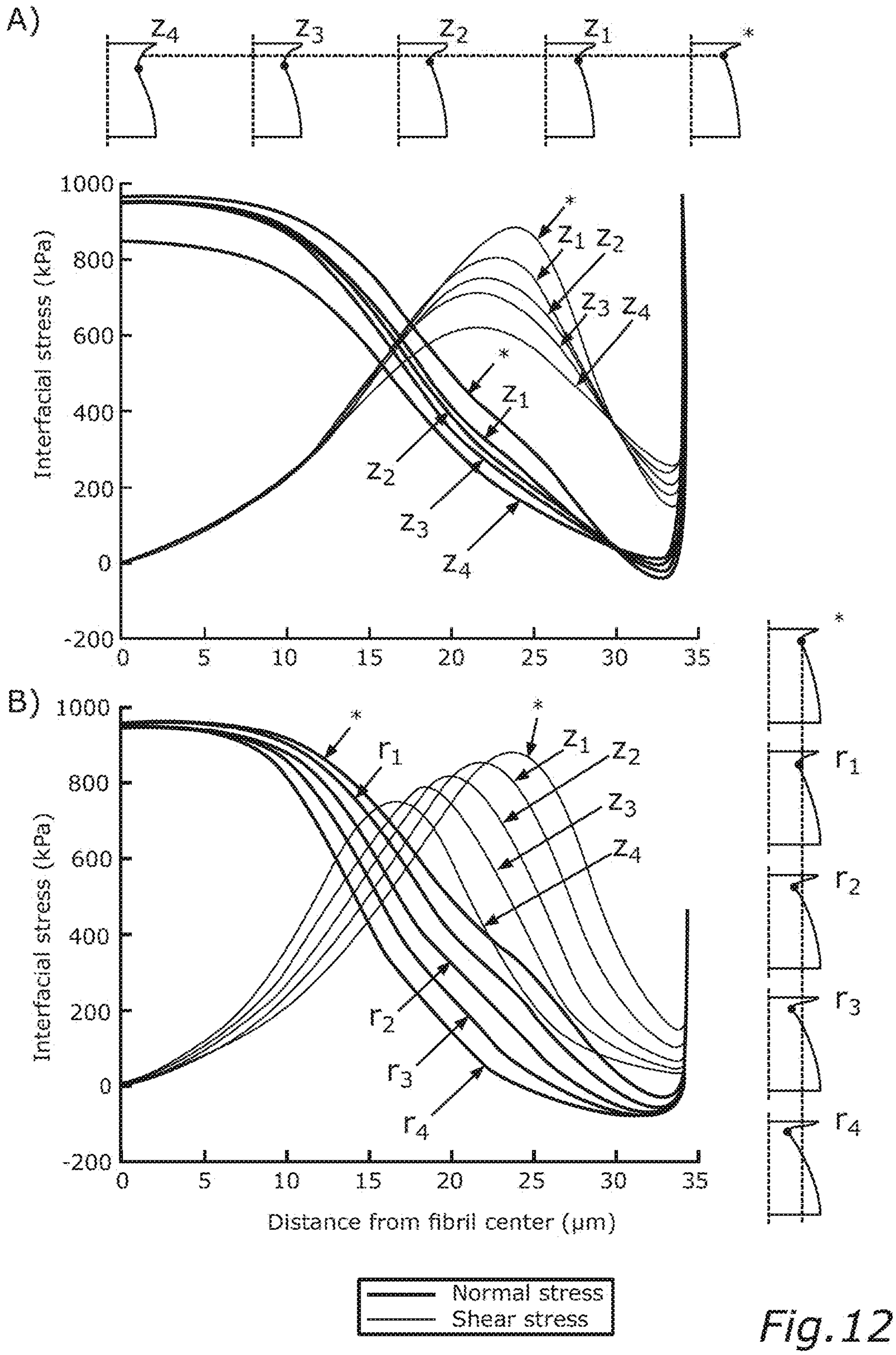

FIG. 12 shows interfacial stress profiles at the detachment of the design variants of $MLF_n$ 10. FIG. 12A shows z-shift variants (i.e., the Bezier point shifts in the z-direction) that indicate, that as the Bezier points moves away from the optimal positions, the stress profile incrementally loses area under the stress profile explaining why the variants have less adhesion compared to the optimal shape. Note that the adhesion is the surface integral of the normal interfacial stress, which is directly related to the area under each normal stress profile. FIG. 12B shows the r-shift variants (Bezier points shift in r-direction) indicating a similar trend as FIG. 12A, by incrementally losing the integration area under the normal stress profile.

Figure 13:
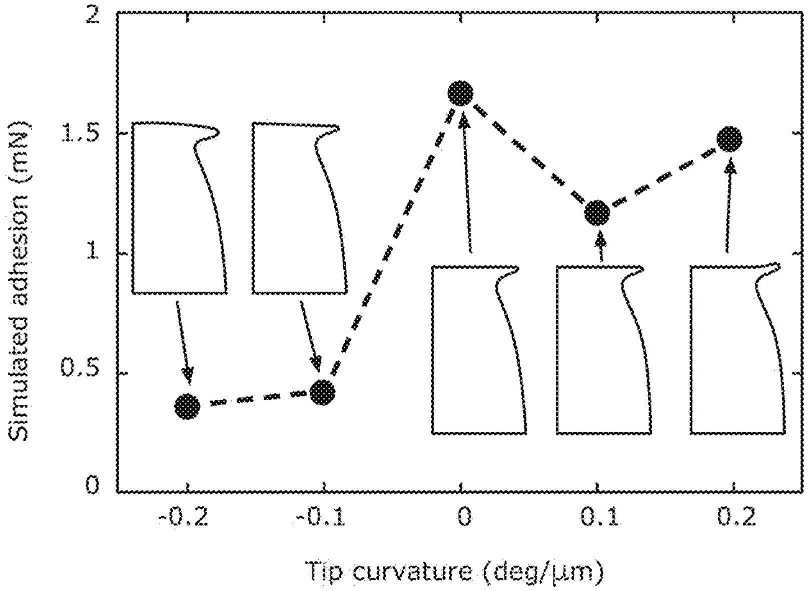

FIG. 13 shows an adhesion sensitivity analysis on the tip curvature of 70 μm-diameter $MLF_n$ 10. The positive curvature represents a convex tip shape and the negative curvature represents a concave one. There is a significant adhesion decrease at the negative curvature, as it promotes more edge singularity. The shape is only robust to the convex shape of the tip 28; however, the MLF 10 shows the best adhesion performance in the case of a flat tip surface on flat surfaces.

Figure 14:
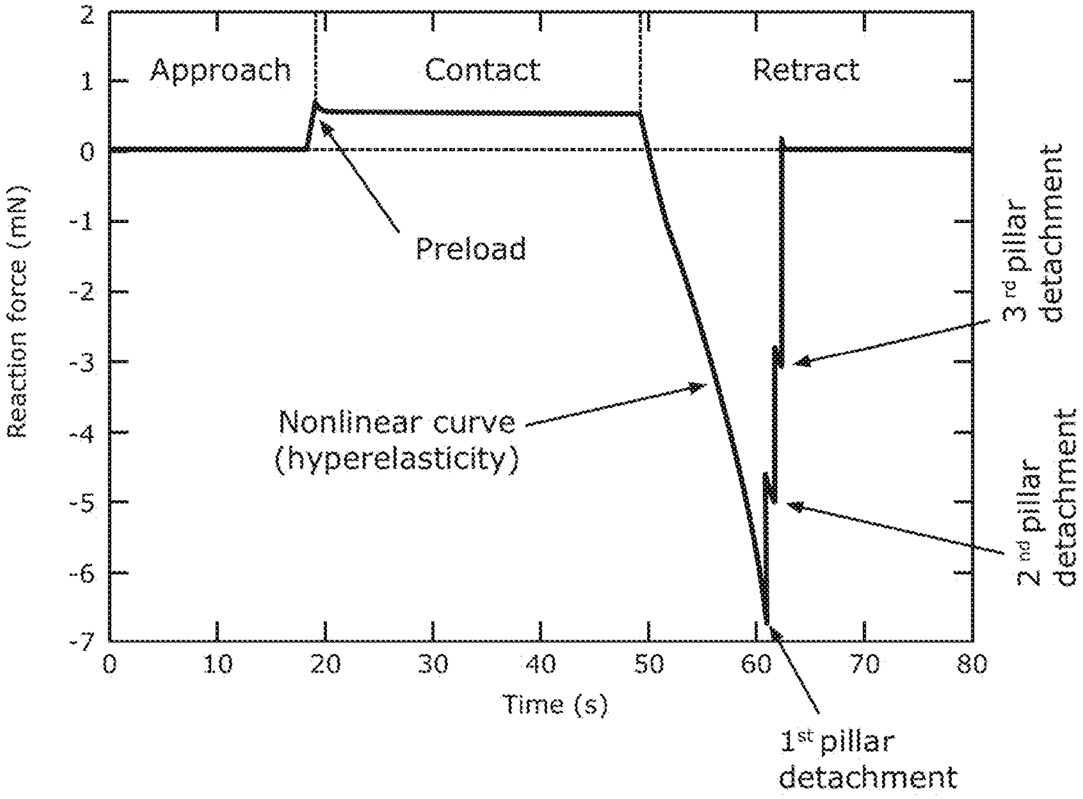

FIG. 14 shows a representative force-time curve of $MLF_n$ 10 with 70 μtip diameter. During the retraction, due to the hyperelasticity, a nonlinear material behavior is observed. Because three fibrils are adhered to the probe, three peaks of detachment are observed.

Figure 15:
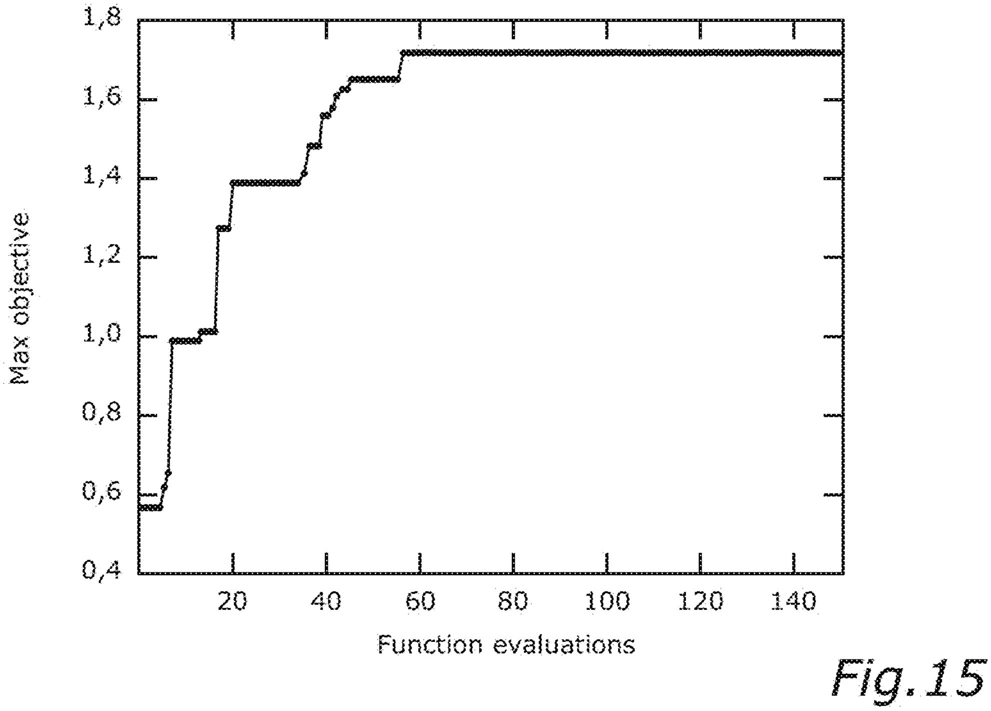

FIG. 15 shows a process of the Bayesian optimization in case of 70 μm-diameter $MLF_n$ 10. The maximum objective (y-axis) represents the simulated adhesion values in mN unit in this problem. As the function evaluation increases, the adhesion values improve. From the initial random trial, the process reaches the optimal value in around 60 iterations.

Figure 1:
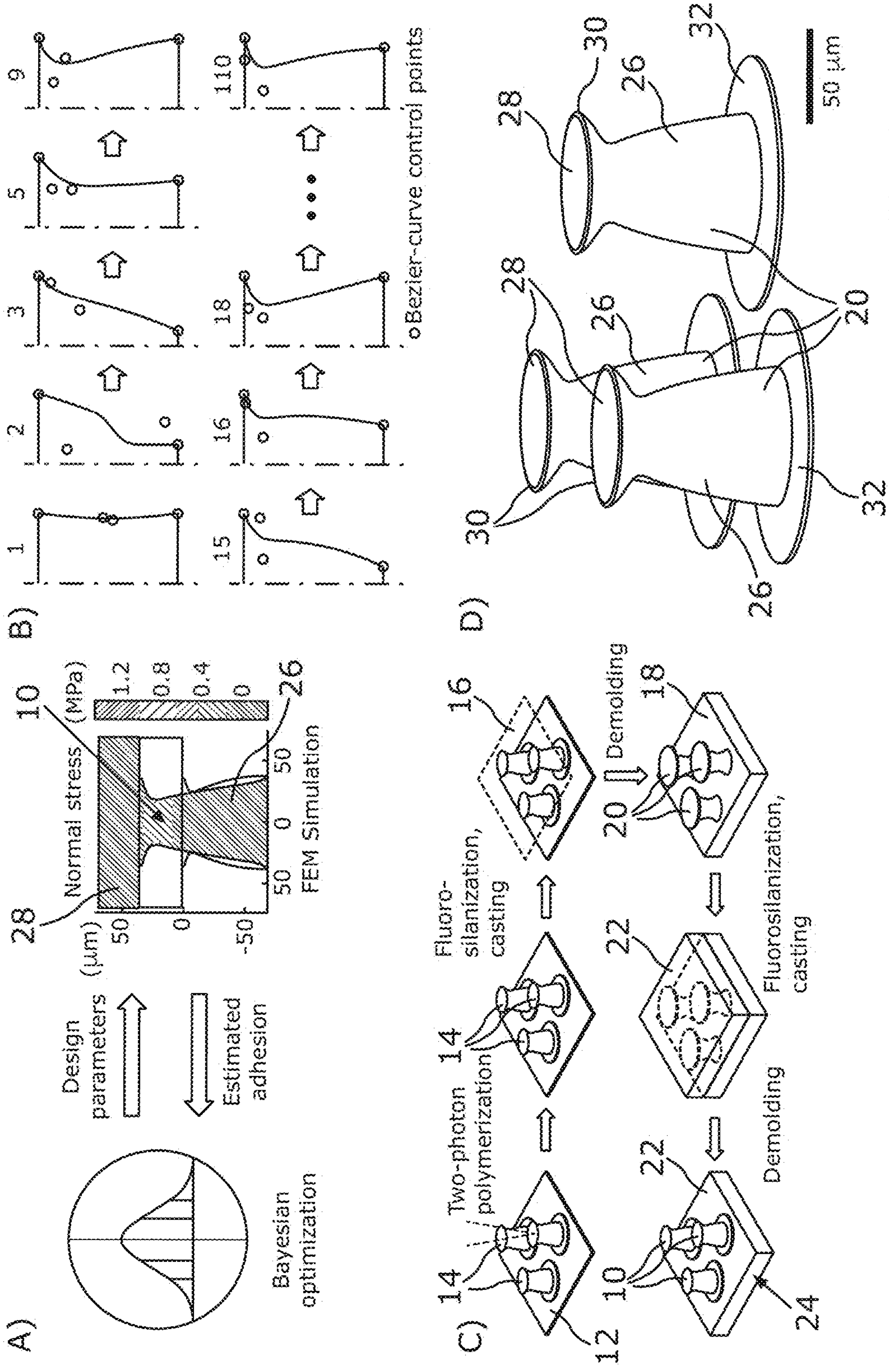

The proposed computational single fibril design framework has two components: FEM-based adhesion mechanics simulation and Bayesian optimization (FIG. 1A). During the design process, the optimizer generates design parameters for the simulation of the fibrils 10, whereas the simulator returns an estimated adhesive force based on the design parameters from the optimizer for the fibrils 10. This process runs iteratively until a preset iteration limit and the optimizer returns the optimal design parameters based on the observations along the design process.

In the simulation, the shape of the fibril 10 is constructed by design parameters with the following assumptions. First, the fibril 10 is assumed to be axisymmetric and the attached surface is assumed to be smooth and locally flat, as in the case of typical T- and mushroom-shaped fibril 10 designs. Additionally, the aspect ratio of the fibril is set to be 1:1 in order to compare the fibril 10 with other fibril designs at the same aspect ratio, which removes the effect of having different aspect ratios on adhesion tests.

Next, the side profile of the fibril 10 is constructed by a Bezier curve, which connects the top edge of the fibril 10 to the base of the fibril 10 smoothly with a given number of control points (FIG. 1B). A 3rd order Bezier curve is used to represent the fibril's profile including its tip 28 and stem 26, however, the order of the curve could be increased for finer definition with higher computational cost.

The effects of Bezier curve order are used to represent the fibril profile on adhesion (FIGS. 5 and 6). By fitting the previously proposed optimal fibril profile from into 4th-order Bezier curve with R2 value of 0.9999 (FIG. 5), it is shown that 4th-order Bezier curve is enough for representing the profile of the current fibril adhesives.

Additionally, by predicting the maximum adhesion of MLFs 10 with higher order Bezier curves, FIG. 6 shows that Bezier curve of 4th-order shows the best among the MLFs 10 with various order Bezier curves. Overfitting behavior is observed in much higher order Bezier curves.

Finally, the simulation takes the fabrication constraints into account, where an infinite sharp edge is not possible to fabricate in practice. Therefore, the edge 30 of the tip 10 is rounded by a certain fillet radius, estimated from the experimental fabrication test results by the two-photon-polymerization-based direct 3D microprinting technique used in this study.

Once the shape of a fibril 10 is determined at a given iteration step, the adhesion of such a fibril 10 is simulated in a FEM simulation environment. Here, the simulation considers nonlinear deformation of a fibril during adhesion tests by incorporating the Mooney-Rivlin hyperelastic model, and a realistic detachment of the fibril 10 from a flat-punch probe using a Dugdale-Barenblatt cohesive zone model (FIGS. 3A & B). This approach reflects changes of the stress profile during the fibril stretch and before the detachment of the fibril 10, which results in a direct adhesion value estimation rather than an indirect adhesion estimation based on a fixed interfacial stress profile. Assuming that the fibril tip 28 is contacted to a smooth flat-punch probe fully, the adhesion is calculated by integrating the normal stress on the surface of the base 32 of the fibril 10 (see FIG. 1D). When the fibril 10 is stretched due to the tip 28 adhesion, the hyperelastic model predicts the deformation of the tip 28 and the stem 26.

When a crack forms at the tip-substrate contact interface due to a normal stress exceeding the interfacial theoretical strength, the adhesion quickly reaches its maximum and decays subsequently. Here, the material properties and fabrication constraints determining the achievable edge sharpness are characterized experimentally and calibrated before the design of the fibrils 10.

The aforementioned simulation framework is directly linked to a Bayesian optimization framework. Bayesian optimization is a state-of-the-art global optimization method for problems where it is vital to optimize a performance criterion while keeping the number of evaluations of the system small. This method becomes an ideal candidate for minimizing the number of FEM-based adhesion evaluations without compromising the simulation accuracy. Here, the optimization goal is to maximize the adhesive force. The optimizer takes the Bezier-curve control points as optimizable variables and reaches to the optimal design in a given iteration number (FIG. 1B). The other parameters, such as the tip 28 diameter and the fabrication constraint-related edge sharpness limit, are preset before the optimization.

A previous study used a trained deep-neural-network (DNN), which simulates the adhesion profile at the interface. The difference lies in the simulation accuracy and data efficiency. First, the DNN-based approach does not compute the adhesion directly from the simulation, rather it estimates the adhesion indirectly with an infinitesimal fibril stretch. This approach would not be accurate when the fibril 10 is deformed due to the elasticity of the material, where the stress profile drastically changes.

Soft elastomers, such as polydimethylsiloxane (PDMS) used in our experimental fibrils 10 and in all previous T- and wedge-shaped mushroom fibril studies, do stretch significantly during the pull-off process resulting in hyperelastic regime. In contrast, the present method estimates adhesion directly right before the detachment considering the hyperelastic body deformation of the fibrils 10. Secondly, the present method is data efficient by orders of magnitude more than the DNN-based approach. More specifically, the present method allows to find an optimal shape within 150 function evaluations, whereas the DNN-based method requires more than 200,000 function evaluations to create a training dataset. Furthermore, the DNN-based approach is not flexible because a single change in the simulation might require another whole set of data causing a significant computational time.

Once the optimal fibril design is obtained, such fibril 10 is fabricated using two-photon polymerization (2PP) process and a subsequent double-molding-based replication technique (FIG. 1C). This fabrication method is versatile to create various shapes as well as allows the use of various elastomeric materials. PDMS is selected as the fibril material because it is commonly used in the dry fibrillar adhesion field, versatile, flexible as well as it exhibits less surface energy, less environmental sensitivity, and less viscoelastic effects compared to other fibril elastomers, such as polyurethane.

First, computer-aided-design (CAD) files of the fibrils 10 are 3D-printed using a high-resolution rigid photoresist using 2PP to create a master template, and then fluorosilanized to allow easy replication. Afterwards, PDMS is casted on the master template to form a negative replica, cured, peeled off, and then fluorosilanized. Finally, the fluorosilanized PDMS negative mold 18 is replicated again to create a PDMS fibril 10 replica of the original master 12 (FIG. 1D).

The machine learning-based optimally designed fibrils (hereafter MLFs) with various tip diameters (30, 50, 70, 90 μm) are designed and fabricated (FIG. 2A and FIG. 7). Two types of MLFs 10 based on the interfacial stress type were created, which causes a failure: MLFn 10 based on normal stress failure and MLFv 10 based on von-Mises stress failure at the interface. Here MLFv 10 to understand the role of the shear stress to adhesion by comparing it with the result of MLFn 10. The critical simulation parameters, such as the sharpest edge radius that we can fabricate, hyperelastic model parameters, and the theoretical adhesion strength of the contact interface are experimentally measured and updated in the simulation before the design optimization.

A triplicate of each design was generated forming a tripod for accurate alignments with a smooth spherical glass probe (the diameter of the probe (8 mm) is much larger than the diameter of the fibril (30-90 μm); therefore, a flat-flat contact interface can be assumed locally), while keeping the number of fibrils minimum to reduce the effect of multiple fibrils on a soft backing layer (FIGS. 7 and 8). Previously reported fibril shapes are also fabricated to compare their adhesion as controls/references. A flat-punch fibril 10, wedge-shaped mushroom fibril 10, and modified T-shaped fibril 10, which has a fillet radius between the fibril and the cap. Additionally, due to the fabrication limitation, the ML-based optimal fibril is compared in the simulation framework with the other control and MLF fibrils 10 (FIG. 9).

The MLFs 10 result in unique stem 26 and tip 28 shapes compared to the previous fibrils. The shape of the MLFs 10 features a sharp tip edge 30 with a large wedge, a narrow neck, and a thickening body towards the base 32 of the fibril 10 (FIG. 2A). The optimization process seems to capture the tip edge 30 singularity by creating sharp tip edges. This makes the tip geometry rather similar to the other fibrils 10. However, the significant differences are found in the neck and stem shapes. Here, as the narrow neck and the thickening stem help reduce stress concentration at the tip edge 30 when the fibril 10 is stretched by transferring the most of the stress to the center of the fibril tip 28.

Compared to the previously reported narrow neck designs to minimize any misalignment errors, these new designs utilize the stem deformation to alter stress profile at the interface along the stretch of the fibril 10 (see FIGS. 3A,B and the details given in the following section).

FIGS. 2B & C show comparative adhesion measurements of the fibrils in simulations and experiments. First of all, adhesion improvement is observed in MLFn for most of the tip diameters (50, 70, 90 μm, except 30 μm) compared to other designs. MLFn 10 shows 77% adhesion improvement over modified T-shaped fibril 10 with the size of 50 μm tip diameter in the experiment. Compared to MLFn 10, the MLFv 10 does not show great adhesion performance, indicating that the shear stress minimization at the interface does not affect the adhesion performance positively. This could be explained comparing the stress profiles of MLFn 10 and MLFv 10, where MLFv 10 has lower shear stress along the stretch (FIG. 3C and FIG. 10C). In the small (30 μm) tip diameter case, MLFs 10 show worse adhesion compared to the other designs. A relatively large edge radius and a large wedge (FIG. 7) show that the algorithm fails to minimize the edge singularity.

In general, the predicted adhesion shows agreement with the experiments. In most of the cases the trend is captured, where the flat-punch fibrils 10 show the lowest and the MLFn 10 fibrils show the highest adhesion followed by T-shaped fibrils 10. Even the absolute adhesion values are predicted close to the experiments. The increasing discrepancy of the adhesion in the large fibrils 10 is considered to be attributed from the relatively increasing curvature of the measurement probe compared to the size of the tip of the fibrils 10, where flat-flat interfacial contact is compromised.

MLFn fibrils 10 show overall superior adhesion compared to the fibrils proposed in the prior art (FIG. 9).

The present further finite element analysis (FEA) on the interfacial stress and fibril stretch (FIG. 3) reveals that the stress profile changes greatly during stretching a fibril 10. More importantly, the location of a peak stress changes from the edge 30 of the tip 28 to the center of the tip 28 due to the stem deformation. This fact suggests that the design of an adhesive fibril 10 should consider stress profiles not only at the beginning of the tip detachment (which is the case in the prior art), but also at during all detachment process due to the deformation of the fibril tip 28 and stem 26.

In case of MLFn 10 (70 μm tip diameter), when a fibril 10 is insignificantly stretched (25% strain in FIG. 3A for MLFn and FIG. 10A for MLFv), the stress pattern throughout the body forms a convex gradient pattern. More importantly, the peak stress occurs at the edge 30 of the fibril tip 28 (FIGS. 3A,C). However, this peak stress is not enough to form a crack to initiate detachment of the fibril tip 28 from the probe with this amount of strain. When the fibril 10 is stretched significantly (100% strain in FIG. 3B for MLFn and FIG. 10B for MLFv), the stress pattern in the stem changes due to the deformation. The stress gradient in the stem forms a concave pattern now (FIGS. 3B & C and FIGS. 10B & C: MLFv). The most critical part is the change of the location of the peak stress; it occurs at the center of the interface compared to the edge 30 at the beginning, which means that the stress singularity at the beginning might not be critical for fibrils which experience such large deformations. Furthermore, the stress profile reveals that MLFn reached 46% of the theoretical maximum by calculating the fraction of the area under the normal stress profile over the full rectangular area composed of the theoretical interfacial strength and the tip diameter.

Fabrication constraints impact the optimal design and adhesion. The fabrication constraints worsen the adhesion performance due to the edge singularity induced by a rounded edge 30. The presented design methodology reflects such fabrication constraint, where it changes the optimal shape to cope with the edge singularity. To understand how a fabrication constraint changes the optimal design proposed by the algorithm, a set of design optimizations is performed. The edge fillet radius, re, (not the radius of the fibril) is chosen as a control variable, and the algorithm performs design optimizations for each re. Here the fibril diameter is set as 70 μm as a representative case.

The present simulation analysis suggests that the fabrication constraint greatly impacts the optimal shapes of the fibrils 10, showing that such constraints must be considered in the design processes. When such constraint is negligible compared to the size of the fibril 10, the optimal shape shows sharp edge with relatively thick neck and stem (FIG. 4A). The upper part of the body 26 is very close to the wedge-shaped fibrils, showing an agreement with previous analysis on the shape of the fibrils 10.

The design changes when the fabrication constraint becomes non-negligible. As the constraint increases, the fibril tends to show much narrower neck compared to the designs with less constraint. Also, the body shape changes by having a narrower body 26. These could be interpreted as to minimize deformation at the top body, by transferring most of the deformation to the lower body, which might reduce the risk of increasing stress peak at the tip-surface interface. Nonetheless, as the constraint increases, the adhesion deteriorates multifold due to the increased peak stress at the edge. Additionally, the analysis on the effect of the size of the fibril tip 28 with a given fabrication limit is shown, where such fabrication limit affects the optimal shape similar to above analysis (FIG. 11). The proposed design framework generates different optimal fibril shapes for different fabrication limits and tip sizes.

The effect of the fibril body shape is further analyzed to understand its role in the fibril adhesion. It is found that the adhesion significantly depends on the fibril stem shape 26, whereas most of the previous studies focused only on the tip geometry. For example, small differences in the stem shapes of MLFv and MLFn (70 μm tip diameter, FIGS. 2A & C) result in almost 80% adhesion performance difference in the experiment. To understand this, the 70 μm MLFn is chosen (marked as * in. FIG. 4B) as the base design and the two Bezier control points which forms the profile are modulated in radial and axial manner (r- and z-direction in the inset of FIG. 4A) in simulations. The other Bezier control points at the ends of the curve are fixed.

The change in the radial control points shows high sensitivity in the adhesion performance. As the radial control points move towards the axis, the neck shape gets narrower resulting in the change of the curvature of the lower body, while the general wedge shape remains steady. This change of the stem shape is directly reflected in the adhesion, by having lower adhesion with a thinner stem (FIG. 4B, blue line). This fact explains the aforementioned adhesion difference between MLFn and MLFv (70 μm case, FIGS. 2A & C). On the contrary, the axial control points affect the adhesion less than the radial control point shifts (FIG. 4B, red line), which change the height of the neck, while keeping the body thickness similar.

The interfacial stress analysis of these variants (FIG. 12) show smaller area under the normal stress profile than the original MLFn optimal design, explaining the decreased adhesion of these variants. Note that the adhesion is the surface integral of the normal interfacial stress, which is directly related to the area under each stress profile. Here, the reason why some direction affects more than the other is rather complex and unclear, but it is important to note that the shape of the body 26 affects the adhesion by transferring the stress from the base 32 to the tip 28 as shown in FIG. 3. The stem shape sensitivity shown here suggests that it is important to consider the stem shape in the design optimization, which has not been well highlighted in the previous studies. Additional to those, top surface shape of the fibril 10 affects the adhesion.

The additional simulation study suggests that concave shape of the top surface resulted in a dramatic decrease of the adhesion, which is the worst-case scenario in dry adhesion optimization due to the increased edge singularity (FIG. 13). On the other hand, the MLFn is robust to the convex tip shape as it does not cause direct edge singularity. Nonetheless, the MLFns are optimized for the flat tip surface and shows the optimal performance with the flat tip interface similar to all previous fibril adhesion optimization studies.

The study proposes a design framework of adhesive fibrils 10 based on Bayesian optimization and FEM-based adhesion mechanics simulations, its experimental validation, and analyses of the newly designed optimal shapes. While most of the previous studies focused on designs based on bioinspired T- and wedge-shaped tips and human intuition, this disclosure provides another perspective purely based on a machine learning algorithm. This new perspective discovered novel optimal designs and improved the adhesion performance significantly in the experiments. Compared to the previous optimal design frameworks, the proposed framework allows to incorporate full adhesion FEM simulations in the optimization loop for accurate results. The optimal designs computed by the proposed framework are validated by the simulations and experiments, and provide the evidences that 1) the large axial stem deformation causes the fibril tip 28 stress profile change, 2) fabrication constraints are important to be incorporated in the design process, and 3) fibril stem 26 shape is also important to the adhesion performance.

The design method is compared with the other approaches by allowing hyperelastic deformation of a fibril 10 in simulations. There are numerous studies to predict or to optimize adhesion using simulations. However, most of the studies assume that the adhesive fibril does not change shape during the pull-off or deforms very small staying in a linear deformation regime. However, soft elastomers, such as PDMS, stretches significantly during the pull-off process (more than 100% strain before detachment in our experiments, see FIGS. 8 and 14) showing that the hyperelasticity must be considered. Stress profile analysis confirms that the peak stress location even changes along the stretch of the fibril 10 from the edge to the center, showing that edge singularity at the beginning of the stress might not affect the adhesion when the fibril 10 is actually detaching. The consideration of whole stretch allows a direct and accurate adhesion estimation, which helps the optimizer to generate adhesion-improved fibrils.

This disclosure also provides an insight to infer the role of shear stress on the normal adhesion. The trial by generating shear minimized MLFv reveals that indeed the shear stress may not affect the normal adhesion adversely, rather there is a positive correlation between them. Comparing the simulation and experimental results (FIGS. 2B & C, FIG. 3, and FIG. 10), the shear-minimized fibril performed worse in the experiment than the simulation, suggesting that the shear stress helps normal adhesion as discussed in.

The FEM simulation is designed to estimate adhesion based on the design parameters (FIG. 1A, FIG. 2C, and FIG. 4) and to analyze the tip stress profile (FIG. 3). Using a commercial finite element method tool (COMSOL Multiphysics 5.4, COMSOL Inc.), the interfacial stress distribution and the maximum adhesion are estimated based on the approach of with a modification by implementing the Mooney-Rivlin five-parameter hyperelastic model of the material. During the simulation, the fibril's 10 base 32 is fixed and the tip of the fibril 10 is initially attached to a flat-punch probe. The position of the probe is then iteratively translated to impose stretch to the fibril 10. The simulation terminates itself when the maximum interfacial normal stress reaches the theoretical interfacial strength.

Material characterization experiments are performed before the simulation. This is because soft elastomer (PDMS) fibril 10 might behave differently in small scales than in bulk in terms of mechanical properties. For this calibration, first, different shapes of fibrils 10 (flat punch, wedge-shaped, T-shaped in 30, 50, 70, 90 μm diameter) are fabricated using with 2PP and double-molding-based replication method (FIG. 1C). Afterwards, adhesion and force-displacement curves are measured to calibrate the Mooney-Rivlin five parameters and theoretical interfacial strength. Additionally, by taking scanning electron microscope (SEM) images of the fibrils, the fabrication constraint (the tip edge fillet radius) is characterized.

A shape of a fibril 10 is determined by two sets of parameters: fixed parameter set and optimizable variable set. The fixed parameter set includes aspect ratio, tip diameter, edge fillet radius, the Mooney-Rivlin parameters and the theoretical interfacial strength. The optimizable parameter sets include two Bezier control points and the fibril base 32 diameter. The geometry of the fibril is axisymmetric. Once the shape is determined, a fibril 10 is meshed with more than 10,000 triangular elements, with extremely fine meshes towards the edge of the fibril to handle the interfacial stress singularity.

Bayesian optimization. Once the FEM simulation is constructed, the optimizable variable set, x, is directly handled by the Bayesian optimizer to produce the optimal adhesive fibril 10. Here, x is a 5-dimensional vector including two Bezier control points in r- and z-coordinate, and the diameter of the fibril base 32. The optimization problem is formulated as $$x^* = \underset{x}{\operatorname{argmax}} f(x, p) \text{ subject to } x_{min} < x < x_{max}$$

where f(•) is the estimated adhesive force from the simulation, x* is the optimal variable set, p is the fixed parameter set, xmin is the lower bound of x, and xmax is the upper bound of x. This optimization problem is solved with a prebuilt Bayesian optimization function (bayesopt.m) in a proprietary programming language (MatLAB R2020a, The MathWorks, Inc.) with the expected improvement acquisition function. In this disclosure, the adhesion converges within 150 iterations. The communication between the optimizer and the simulator is established via LiveLink™ (COMSOL Multiphysics 5.4, COMSOL Inc.). The total of 150 iterations combined with optimization and simulation took less than 3 hours to produce the final design of the fibrils 10 using a performance desktop computer (20 cores of Intel Xeon CPU E5-2680 v2, 2.80 GHz (40 logical cores), 192 GB RAM, NVIDIA Quadro K5000 graphics card). The process of the Bayesian optimization and convergence is shown in FIG. 15.

The fabrication process is similar to the fabrication method presented in PCT/EP2020/084461 whose disclosure regarding the precise steps of manufacture are hereby incorporated by reference, with modification in the fabrication parameters for sharper edge definitions. First, the fibrils 10 are designed using a CAD software (SolidWorks 2020, Dassault Systemes Co.), and then converted to a 2PP raster file (DeScribe, Nanoscribe GmbH), and printed using a 2PP 3D microprinter (Photonic Professional GT, Nanoscribe GmbH). The masters 12 are printed on an indium tin oxide (ITO)-coated glasses using a rigid IP-S commercial photoresist (Nanoscribe GmbH). To enhance the adhesion between the ITO-coated glass and the fibrils 10 to be printed, the ITO-coated glass is exposed to 1,1,1,3,3,3-hexamethyldisilazan (HMDS) in a desiccator more than 6 hours before the 3D print. Afterwards, the master 12 is developed in propylene glycol monomethyl ether acetate (PGMEA, Sigma-Aldrich Inc.) for 40 min and rinsed in isopropyl alcohol (IPA) for 3 mins. After the master fibril array (4×5) is fabricated, the array is exposed to ozone plasma (ozone plasma chamber, Zepto, Diener electronic GmbH) in 80° C. for 30 mins for surface activation, and subsequently placed in a vacuum desiccator with a glass vial containing 0.1 mL of trichloro (1H,1H,2H,2H-perfluoroctyl) silane (Sigma-Aldrich Inc.) for 35 mins. Finally, the master 12 is placed in 90° C. oven for 35 mins.

Degassed PDMS mixture (20:1 monomer to crosslinker ratio) is casted on top of the fluorosilanized master array and degassed for 30 mins in a vacuum desiccator. Then the master 12 and the cast are baked in a 90° C. oven for 35 mins. Afterwards, the negative mold 18 is peeled off. To silanize the negative mold 18, a similar procedure is applied. The negative mold is exposed to ozone plasma in 80° C. for 30 mins, and placed in a vacuum desiccator with trichlorosilane for 40 mins. Afterwards, the negative mold 18 is baked in 65° C. for 3 hours. After the negative mold 18 is peeled off, PDMS mixture (10:1 monomer to crosslinker ratio) is casted on top of the negative mold 18, degassed for 30 mins, and cured for 3 hours in a 65° C. preset oven. The positive replica is ready after peeled off from the negative mold 18. The surface roughness of the fibril surface is Rq of 0.42 μm with cutoff frequencies of λs=0.25 μm and λc=0.25 mm. Young's modulus of PDMS (65° C. cured for 3 hours) is 1.6 MPa. As the material behave different at the microscale, adhesion test of the T-shape fibril 10 (FIG. 8C) is used as the baseline stress-strain curve to fit a hyperelastic model (Mooney-Rivlin 5th order model) for the present simulation framework due to the known shape and relative strong adhesion compared to other fibril shapes. The 5th order Mooney-Rivlin parameters are C10=−1.81e+06 Pa, C01=3.04e+06 Pa, C20=9.82e−09 Pa, C02=−1.52e+05 Pa, C11=6.83e+05 Pa.

Adhesion measurements. The adhesion of the fibrils 10 is tested in a customized adhesion setup. A load cell (GSO-25, Transducer Techniques LLC) is attached to a vertically moving (axial direction to the fibrils) high-precision motorized piezo stage (LPS-65 2", Physik Instrumente GmbH) with 5 nm positioning resolution. Horizontal positions (xy-position) are adjusted by manual xy-stage with an additional motorized piezo stage. The motion control of the motorized stages and the force measurement from the loadcell are performed simultaneously in a custom-built program in LabVIEW environment (National Instruments Co.) with 1 KHz data acquisition rate. The raw data is filtered to reduce noise with 10 points median filter. An inverted optical microscope (Axio Observer A1, Carl Zeiss AG) is placed under the setup to visualize the contact interface for alignments and adhesion analyses.

A spherical glass probe with a diameter of 4 mm is used as a probe directly connected to the load cell. The surface roughness of the glass probe is Rq of 1.04 μm with cutoff frequencies of $\lambda s$=0.25 μm and $\lambda c$=0.25 mm. The xy-position of the probe is carefully adjusted to place the probe at the center of the triplicate of the fibrils 10. The approach and retraction speeds are 10% of the fibril size per second (e.g., 7 μm s−1 for 70 μm fibril) to minimize the viscoelastic effects. The probe indents until it reaches a certain preload (150 kPa for all sizes; e.g., 0.577 mN for 70 μm tip diameter fibril 10), waits for 30 seconds for the relaxation, and is retracted (FIG. 14). The adhesion is measured together with displacement to form force-displacement curves (FIG. 8). The measurements are performed 5 times per each design of the fibril 10 and the adhesion is estimated as the average of the measured adhesion per fibril 10. Because the multiple fibrils 10 are detached, multiple spikes in the adhesion curves are observed (FIGS. 8 and 14).

What is claimed is:

1. A method of making one or more fibrils, the method comprising the steps of:
- providing a material of manufacture of the one or more fibrils;
- providing a random initial shape of the one or more fibrils, with each fibril of the one or more fibrils comprising several surfaces;
- calculating an adhesive force of the one or more fibrils based on the material of manufacture of the one or more fibrils and on the provided random initial shape of the one or more fibrils, wherein the calculating of the adhesive force is carried out by a standard finite method based on Cauchy's equation;
- adapting the random initial shape of the one or more fibrils to vary the adhesive force of the one or more fibrils to form resultant shapes of the one or more fibrils and determining the corresponding adhesive force of each resultant shape of the one or more fibrils;
- selecting the resultant shape of the one or more fibrils having the highest adhesive force of the one or more fibrils; and
- producing one or more fibrils having the selected resultant shape having the highest adhesive force of the one or more fibrils.

2. The method according to claim 1, wherein the initial shape of the one or more fibrils comprises an axisymmetric shape having an at least locally flat tip surface at an end thereof and a profile of the one or more fibrils are defined by a set of parameterizable curves comprising Bezier curves, spline curves, or polynomial curves.

3. The method according to claim 1, wherein the initial shape of the one or more fibrils resembles the shape of a previously produced shape comprising a T-shaped fibril, a wedge-shaped fibril, a mushroom-shaped fibril and/or combinations of the foregoing.

4. The method according to claim 1, wherein the step of calculating the adhesive force of the one or more fibrils takes place by means of a computer implemented simulation.

5. The method according to claim 1, wherein the step of adapting the initial shape of the one or more fibrils takes place a plurality of times.

6. The method according to claim 5, wherein the plurality of times is selected between 2 and 1000000 iterations and/or wherein the adapting the initial shape stops when the calculated adhesive forces of the resultant shapes converge.

7. The method according to claim 5, wherein the step of adapting the initial shape of the one or more fibrils takes place by varying a smallest edge radius of the fibril tip with a size selected in the range of 1 nm to 10 μm.

8. The method according to claim 1, wherein the step of adapting the initial shape of the one or more fibrils takes place by means of a computer implemented simulation.

9. The method according to claim 1, wherein the step of producing the one or more fibrils takes place by means of at least one of additive manufacturing, two-photon polymerization, 3D printing, optical lithography, electron-beam lithography, focused ion beam machining, laser micro/nanomachining, mechanical or ultrasound micromachining, micro/nanoprinting, roll-to-roll replication, injection molding, compression molding, and polymer casting.

10. The method according to claim 1, wherein the material of manufacture of the one or more fibrils is comprised of organic, inorganic, polymers, rubbers, silicones, polyurethanes, biomaterials, biopolymers, composites, elastomers, liquid crystalline elastomers, thermoplastic elastomers, foams, fabric materials, particle materials, fibrous materials, or combinations of the foregoing.

11. The method according to claim 1, wherein the material of manufacture of the one or more fibrils has a Young's modulus selected in the range of 0.01 to 10000 MPa.

12. The method according to claim 1, further comprising the step of designing the fibril tip edge by defining a radius of curvature between the surfaces of the one or more fibrils.

13. The method according to claim 1, further comprising the steps of:
- providing a boundary interface to which the one or more fibrils are attachable,
- defining a material of the boundary interface; and
- calculating an interfacial stress between the one or more fibrils and the boundary interface.

14. The method according to 13, wherein the step of calculating the adhesive force of the one or more fibrils takes place by means of a computer implemented simulation and wherein the step of calculating an interfacial stress between the one or more fibrils and the boundary interface takes place by means of a computer implemented simulation.

15. The method according to claim 14, wherein the interfacial stress is calculated by Cauchy's equilibrium equations.

* * * * *